US012009387B2

(12) United States Patent
Kang et al.

(10) Patent No.: US 12,009,387 B2
(45) Date of Patent: Jun. 11, 2024

(54) INTEGRATED CIRCUIT DEVICE AND METHOD OF MANUFACTURING THE SAME

(71) Applicant: Samsung Electronics Co., Ltd., Suwon-si (KR)

(72) Inventors: Jun-goo Kang, Seoul (KR); Hyun-suk Lee, Suwon-si (KR); Gi-hee Cho, Yongin-si (KR)

(73) Assignee: Samsung Electronics, Co. Ltd., Gyeonggi-do (KR)

( * ) Notice: Subject to any disclaimer, the term of this patent is extended or adjusted under 35 U.S.C. 154(b) by 22 days.

(21) Appl. No.: 17/323,433

(22) Filed: May 18, 2021

(65) Prior Publication Data

US 2021/0273041 A1 Sep. 2, 2021

Related U.S. Application Data

(63) Continuation of application No. 16/555,210, filed on Aug. 29, 2019, now Pat. No. 11,031,460.

(30) Foreign Application Priority Data

Feb. 20, 2019 (KR) ........................ 10-2019-0020057

(51) Int. Cl.
*H10B 12/00* (2023.01)
*H01L 49/02* (2006.01)
(52) U.S. Cl.
CPC .............. *H01L 28/75* (2013.01); *H01L 28/60* (2013.01); *H01L 28/87* (2013.01); *H01L 28/88* (2013.01);
(Continued)
(58) Field of Classification Search
CPC .... H01L 28/75; H01L 27/10808; H10B 12/31
See application file for complete search history.

(56) References Cited

U.S. PATENT DOCUMENTS 6,377,311 B1 4/2002 Erbar et al.
6,380,574 B1 4/2002 Torii et al.
(Continued)

FOREIGN PATENT DOCUMENTS

CN 1208965 A 2/1999
CN 1334960 A 2/2002
(Continued)

OTHER PUBLICATIONS

Korean Office Action dated Nov. 30, 2023 for corresponding Korean Patent Application No. 10-2019-0020057.
(Continued)

*Primary Examiner* — Farun Lu
(74) *Attorney, Agent, or Firm* — Harness, Dickey & Pierce, P.L.C.

(57) ABSTRACT

An integrated circuit device includes a conductive region on a substrate and a lower electrode structure including a main electrode part spaced apart from the conductive region and a bridge electrode part between the main electrode part and the conductive region. A dielectric layer contacts an outer sidewall of the main electrode part. To manufacture the integrated circuit device, a preliminary bridge electrode layer is formed in a hole of a mold pattern on the substrate, and the main electrode part is formed on the preliminary bridge electrode layer in the hole. The mold pattern is removed to expose a sidewall of the preliminary bridge electrode layer, and a portion of the preliminary electrode part is removed to form the bridge electrode part. The dielectric layer is formed to contact the outer sidewall of the main electrode part.

20 Claims, 36 Drawing Sheets

(52) U.S. Cl.
CPC ......... *H01L 28/90* (2013.01); *H10B 12/0335* (2023.02); *H10B 12/31* (2023.02)

(56) References Cited

U.S. PATENT DOCUMENTS

| | | |
|---|---|---|
| 8,835,274 B2 | 9/2014 | Hu |
| 8,859,383 B2 | 10/2014 | Kim et al. |
| 9,236,427 B2 | 1/2016 | Greeley et al. |
| 9,966,427 B2 | 5/2018 | Cheng et al. |
| 2002/0022357 A1 | 2/2002 | Iijima et al. |
| 2004/0108536 A1* | 6/2004 | Lee .................. H01L 27/10817 257/E21.59 |
| 2004/0248362 A1 | 12/2004 | Nakamura et al. |
| 2005/0230729 A1 | 10/2005 | Won |
| 2006/0038217 A1 | 2/2006 | Mikawa et al. |
| 2006/0086952 A1* | 4/2006 | Kim .................. H10B 12/033 257/211 |
| 2010/0244191 A1 | 9/2010 | Yu |
| 2011/0095397 A1 | 4/2011 | Chung et al. |
| 2011/0102968 A1* | 5/2011 | Choi .................. H01L 29/40117 427/79 |
| 2012/0264271 A1 | 10/2012 | Kuh et al. |
| 2013/0175665 A1 | 7/2013 | Chudzik et al. |
| 2014/0327056 A1 | 11/2014 | Park et al. |
| 2018/0019300 A1* | 1/2018 | Lee .................. H01L 27/10852 |

FOREIGN PATENT DOCUMENTS

| | | |
|---|---|---|
| CN | 107017235 A | 8/2017 |
| JP | H05343639 A | 12/1993 |
| KR | 10-2001-0027081 A | 4/2001 |
| KR | 10-2004-0037852 A | 5/2004 |
| KR | 10-0647465 | 11/2006 |
| KR | 10-2007-0119172 A | 12/2007 |
| KR | 10-2010-0073094 A | 7/2010 |
| KR | 10-2011-0008398 A | 1/2011 |
| KR | 10-2018-0007543 A | 1/2018 |

OTHER PUBLICATIONS

Chinese Office Action dated Oct. 30, 2023 for corresponding Chinese Patent Application No. 201911010135.5.

Office Action for Chinese Application No. 201911010135.5 dated Mar. 26, 2024.

* cited by examiner

INTEGRATED CIRCUIT DEVICE AND METHOD OF MANUFACTURING THE SAME

CROSS-REFERENCE TO RELATED APPLICATION

This application is a continuation of U.S. application Ser. No. 16/555,210, filed on Aug. 29, 2019, which claims priority under 35 U.S.C. § 119 to Korean Patent Application No. 10-2019-0020057, filed on Feb. 20, 2019, in the Korean Intellectual Property Office, the disclosure of each of which is hereby incorporated by reference in its entirety.

BACKGROUND

Example embodiments of inventive concepts relate to an integrated circuit device and a method of manufacturing the same, and, more specifically, to an integrated circuit device including a capacitor and a method of manufacturing the same.

As integrated circuit devices are down-scaled, a space occupied by a capacitor is rapidly reduced. Thus, even if a limit of a space and a design rule in the capacitor is overcome, and/or a thickness, e.g., physical thickness, of the dielectric layer of the capacitor is reduced, development of a capacitor structure in which a leakage current is reduced and a desired electrical characteristic is maintained are being pursued.

SUMMARY

According to some example embodiments of inventive concepts, an integrated circuit device may include a substrate, a conductive region on the substrate, a lower electrode structure on the conductive region, the lower electrode structure including a main electrode part and a bridge electrode part, the main electrode part including an outer sidewall and a lower surface, a dielectric layer contacting the outer sidewall of the main electrode part and contacting the bridge electrode part, and an upper electrode above the lower electrode structure. The main electrode part is spaced apart from the conductive region and includes a first metal. The bridge electrode part contacts the lower surface of the main electrode part and includes a second metal different from the first metal. The dielectric layer is between the upper electrode and the lower electrode structure.

According to some example embodiments of inventive concepts, an integrated circuit device may include a substrate including a conductive region, a lower electrode structure on the substrate, an upper electrode opposite to the lower electrode structure and on the substrate, and a dielectric layer between the lower electrode structure and the upper electrode. The lower electrode structure includes a main electrode part having an outer sidewall contacting the dielectric layer, an inner sidewall defining an internal space, and a lower surface above the conductive region relative to the substrate, the main electrode part including a first metal, and a bridge electrode part contacting the lower surface of the main electrode part and including a second metal different from the first metal.

According to some example embodiments of inventive concepts, an integrated circuit device may include a substrate including a conductive region, a lower electrode structure on the substrate, and a dielectric layer covering the lower electrode structure. The lower electrode structure includes, a capping electrode part extending in a direction extending away from the conductive region, a main electrode part having an inner sidewall contacting the capping electrode part, and an outer sidewall contacting the dielectric layer, the main electrode part including a different material from a material of the capping electrode part, a bridge electrode part vertically spaced apart from the capping electrode part, the bridge electrode part between the main electrode part and the conductive region. The main electrode part is between the capping electrode part and the bridge electrode part.

According to some example embodiments of inventive concepts, a method of manufacturing an integrated circuit device may include forming, on a substrate, a mold pattern defining a hole, forming a preliminary bridge electrode layer on an inner sidewall of the hole, forming, in the hole, a main electrode part having an outer sidewall covering the preliminary bridge electrode layer and an inner sidewall defining an inner space, removing the mold pattern to expose a sidewall of the preliminary bridge electrode layer, removing a portion of the preliminary bridge electrode layer to expose the outer sidewall of the main electrode part, and to form a bridge electrode part formed of a first portion of the preliminary bridge electrode layer, the bridge electrode part between the substrate and the main electrode part, and forming a dielectric layer contacting the outer sidewall of the main electrode part.

DETAILED DESCRIPTION

Figure 1:
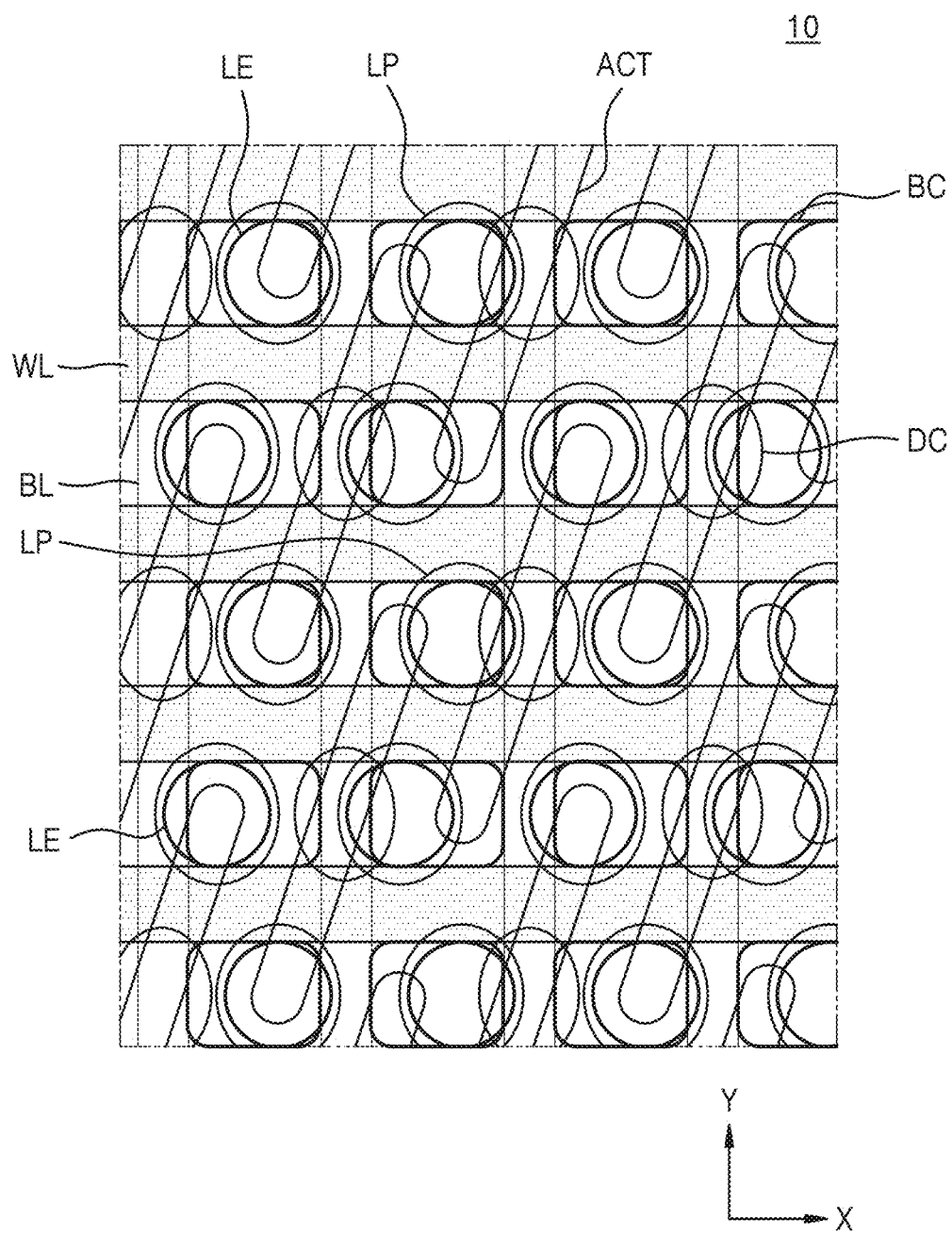
FIG. 1 is a schematic plan view illustrating a portion of a memory cell array of an integrated circuit device according to some example embodiments of inventive concepts.

Various example embodiments will now be described more fully hereinafter with reference to the accompanying drawings. Like reference numerals may refer to like elements throughout this application.

FIG. 1 is a schematic plan view illustrating a portion of a memory cell array of an integrated circuit device, such as a Dynamic Random Access Memory (DRAM) device, according to some example embodiments of inventive concepts.

Referring to FIG. 1, an integrated circuit device 10 may include a plurality of active regions ACT arranged to extend in an oblique direction with respect to an X direction and a Y direction crossing the X direction, in plan view. Each of, or at least some of, the plurality of active regions ACT may extends in a direction at an angle to the X direction. For example, the angle may be between 40 degrees and 80 degrees. A plurality of word lines WL may extend parallel to each other along the X direction and may traverse the plurality of active regions ACT. A plurality of bit lines BL may extend parallel to each other along the Y direction. Each of the plurality of bit lines BL may be connected to each of the plurality of active regions ACT through a direct contact DC and may be disposed over the plurality of word lines WL.

A plurality of buried contacts BC may be disposed between adjacent two bit lines BL among the plurality of bit lines BL. A plurality conductive landing pads LP may be disposed on the plurality of buried contacts BC. Each of the plurality conductive landing pads LP may be overlapped with at least a portion of each of the buried contacts BC. A plurality of lower electrode structures LE may be disposed on the plurality of conductive landing pads LP. The plurality of lower electrode structures LE may be connected to the plurality of active regions ACT through the plurality of conductive landing pads LP and the plurality of buried contacts BC.

Figure 2:
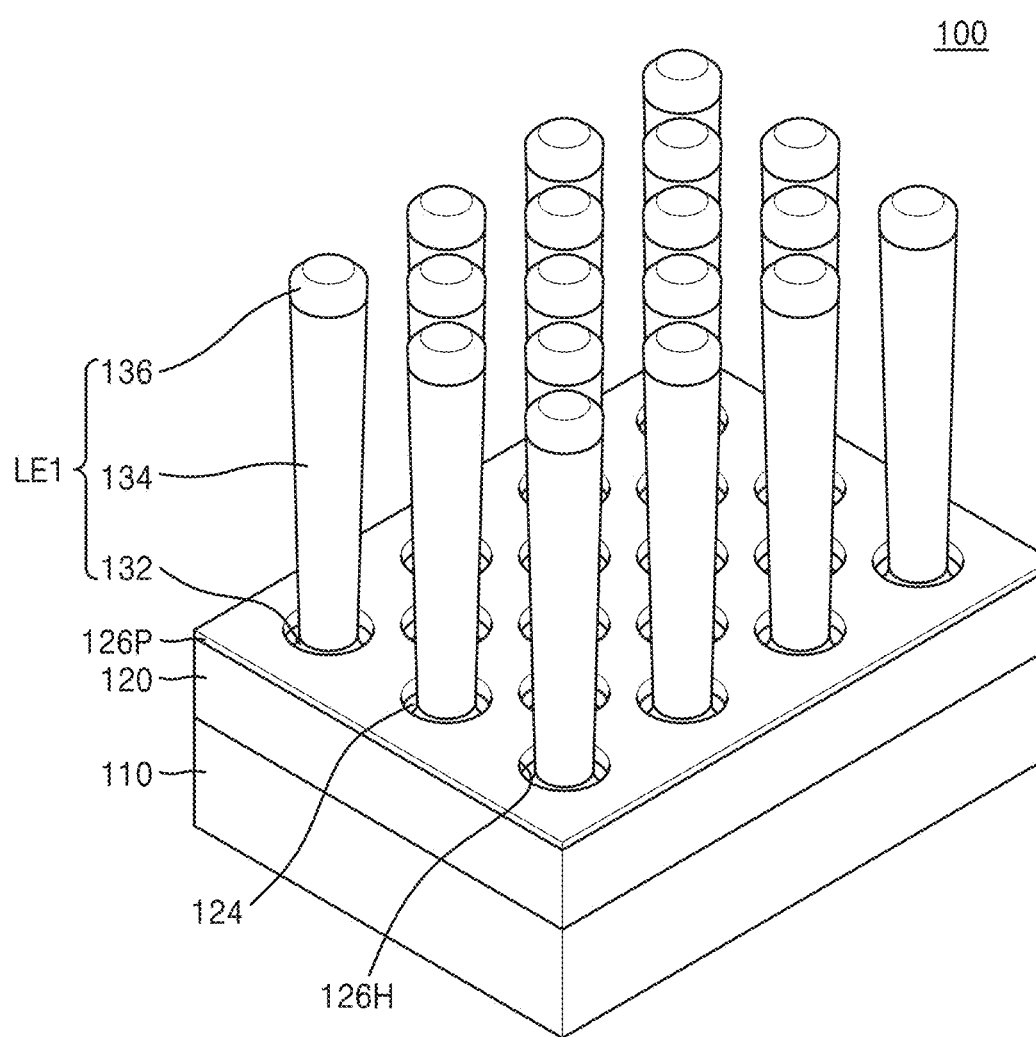
FIG. 2 is a perspective view illustrating a portion of an integrated circuit device according to some example embodiments of inventive concepts.
Figure 3:
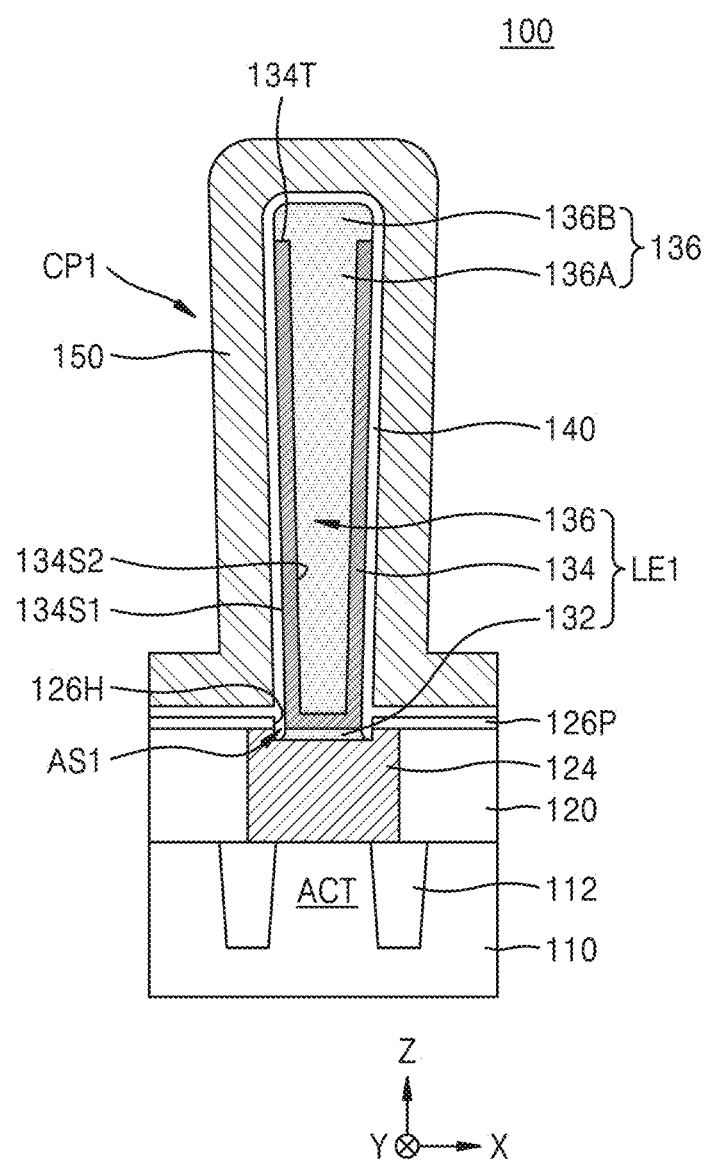
FIG. 3 is a cross-sectional views illustrating a portion of the integrated circuit of FIG. 2 according to some example embodiments of inventive concepts.

FIG. 2 is a perspective view illustrating a portion of an integrated circuit device according to some example embodiments of inventive concepts. FIG. 3 is a cross-sectional views illustrating a portion of the integrated circuit of FIG. 2 according to some example embodiments of inventive concepts. In FIGS. 2 and 3, some elements of the integrated circuit device are omitted and simply illustrated. However, the configuration of the integrated circuit device 100 are not limited to those shown in FIGS. 2 and 3, and may include characteristic configuration elements as will described below.

The integrated circuit device 100 may include a substrate 110 including the plurality of active regions ACT and a lower structure 120 on the substrate 110. A plurality of conductive region 124 may pass through the lower structure 120 to be connected to the plurality of active regions ACT.

The substrate 110 may include a semiconductor element such as Si or Ge, or a compound semiconductor, such as SiC, GaAs, InAs, or InP. The substrate 110 may include a semiconductor substrate and at least one insulation layer or at least one conductive region on the semiconductor substrate. The conductive region may include, for example, an impurity-doped well and/or an impurity-doped structure. In some example embodiments, the substrate 110 may include various isolation structures, such as a shallow trench isolation (STI). The plurality of active regions ACT may be defined by a plurality of isolation regions 112, in the substrate 110. The isolation regions 112 may be formed of or may include oxide, nitride, or a combination thereof.

In some example embodiments, the lower structure 120 may be formed of or may include an insulation layer including a silicon oxide layer, a silicon nitride layer, or a combination thereof. In some example embodiments, the lower structure 120 may include various conductive regions, such as wiring lines, contact plugs, and/or transistors, and an insulation layer for electrically insulating the various conductive regions from each other. The plurality of conductive regions 124 may include polysilicon (e.g. doped polysilicon), metal, conductive metal nitride, metal silicide, or a combination thereof. The lower structure 120 may include the plurality of bit lines BL (refer to FIG. 1). The plurality of conductive regions 124 may include the buried contacts BC (refer to FIG. 1) and the conductive landing pads LP (refer to FIG. 1).

An insulation pattern 126P including a plurality of openings 126H may be disposed on the lower structure 120 and the plurality of conductive regions 124. The insulation pattern 126P may include silicon nitride, silicon oxynitride, or a combination thereof.

A plurality of lower electrode structures LE1 may be disposed on the plurality of conductive regions 124. The plurality of lower electrode structures LE1 may constitute, or be included in, the plurality of lower electrode structures LE as described with reference to FIG. 1. Each of the plurality of lower electrode structures LE1 may have a pillar shape extending long in a vertical direction (a Z direction) perpendicular to an upper surface of the substrate 110 through each of the openings 126H of the insulation pattern 126P from an upper surface of each of the conductive regions 124. A dielectric layer 140 and a top cell plate, e.g., an upper electrode 150 may be disposed on the plurality of lower electrode structures LE1. The lower electrode structure LE1, the dielectric layer 140, and the upper electrode 150 may constitute, or be included in, a capacitor CP1. In FIG. 3, a cross sectional structure of one capacitor CP1 is illustrated.

The lower electrode structure LE1 may include a bridge electrode part 132 and a main electrode part 134 that are stacked, e.g., sequentially stacked on the conductive region 124. The main electrode part 134 may be disposed to be spaced apart from the conductive region 124 in the vertical direction (Z direction) and may have a lower surface above, e.g. opposite to, the conductive region 124. The bridge electrode part 132 may be disposed between the conductive region 124 and the main electrode part 134 and may contact an upper surface of the conductive region 124 and the lower surface of the main electrode part 134.

The main electrode part 134 may have a cross-sectional structure of a cup-shape and/or a cylindrical shape having a closed bottom. The main electrode part 134 may have an outer sidewall 134S1 contacting the dielectric layer 140, an inner sidewall 134S2 defining an internal space of the main electrode part 134, and an uppermost surface 134T farthest from the substrate 110. The main electrode part 134 may include a first metal including transition metal. For example, the first metal may be niobium (Nb). In some example embodiments, the main electrode part 134 may include Nb nitride, Nb oxide, Nb oxynitride, or a combination thereof. The Nb nitride may be represented by NbNx ($0.5 \leq x \leq 1.0$), and the Nb oxide may be represented by NbOy ($0.5 \leq y \leq 2.5$). For example, the main electrode part 134 may include NbN, NbO, NbO$_2$, Nb$_2$O$_5$, or a combination thereof.

The bridge electrode part 132 may include a second metal different form the first metal. For example, the second metal may include titanium (Ti), cobalt (Co), tin (Sn), ruthenium (Ru), tantalum (Ta), iridium (Ir), molybdenum (Mo), or tungsten (W), but is not limited thereto. For example, the bridge electrode part 132 may include TiN, MoN, CoN, TaN, TiAlN, TaAlN, W, Ru, RuO$_2$, SrRuO$_3$, Ir, IrO$_2$, Pt, PtO, SRO (SrRuO$_3$), BSRO ((Ba,Sr)RuO$_3$), CRO (CaRuO$_3$), LSCO ((La,Sr)CoO$_3$), or a combination thereof.

The lower electrode structure LE1 may further include a capping electrode part 136 spaced apart from the bridge electrode part 132 with the main electrode part 134 therebetween. The capping electrode part 136 may extend long in the vertical direction (Z direction) from the internal space of the main electrode part 134 to a location outside the internal space of the main electrode part 134. The capping electrode part 136 may include a first part 136A contacting the inner sidewall 134S2 of the main electrode part 134 and filling the internal space of the main electrode part 134 and a second part 136B that is integrally coupled to the first part 136A, protrudes from the first part 136A in a direction extending away from the substrate 110 and covers the uppermost surface 134T of the main electrode part 134. The first part 136A of the capping electrode part 136 may substantially fill the whole internal space of the main electrode part 134.

The main electrode part 134 and the capping electrode part 136 may include different materials from each other. The capping electrode part 136 may include a third metal. The third metal may be different from the first metal forming the main electrode part 134. The third metal may be or include titanium (Ti), cobalt (Co), tin (Sn), ruthenium, (Ru), tantalum (Ta), iridium (Ir), molybdenum (Mo), or tungsten (W), but is not limited thereto. For example, the capping electrode part 136 may include TiN, MoN, CoN, TaN, TiAlN, TaAlN, W, Ru, $RuO_2$, $SrRuO_3$, Ir, $IrO_2$, Pt, PtO, SRO ($SrRuO_3$), BSRO (($Ba,Sr)RuO_3$), CRO ($CaRuO_3$), LSCO (($La,Sr)CoO_3$), or a combination thereof.

The capping electrode part 136 may be spaced apart from the bridge electrode part 132 with the main electrode part 134 therebetween in the vertical direction (Z direction). In some example embodiments, the second metal forming the bridge electrode part 132 and the third metal forming the capping electrode part 136 may be the same. In some example embodiments, each of the bridge electrode part 132 and the capping electrode part 136 may be formed of or may include a material having a lower resistance, e.g. lower resistivity, than the material forming the main electrode part 134. For example, when the main electrode part 134 is formed of Nb nitride, Nb oxide, Nb oxynitride, or a combination thereof, the bridge electrode part 132 and the capping electrode part 136 may be formed of or may include TiN.

The dielectric layer 140 may include a part interposed between the lower electrode structure LE1 and the upper electrode 150 and a part interposed between the insulation pattern 126P and the upper electrode 150. The dielectric layer 140 may include a part filling a ring-shaped space AS1 between a sidewall of the insulation pattern 126P defining the opening 126H and the bridge electrode part 132. The dielectric layer 140 may not extend into the internal space of the main electrode part 134 and may be disposed outside the internal space of the main electrode part 134. The dielectric layer 140 may including a part contacting the outer sidewall 134S1 of the main electrode part 134, a part contacting a sidewall of the bridge electrode part 132, and a part contacting the capping electrode part 136. In some example embodiments, the dielectric layer 140 may be formed of or may include metal oxide including a fourth metal. The fourth metal may be different from the metals forming the lower electrode structure LE1. In some example embodiments, the fourth metal may include Hf, Zr, Al, Nb, Ce, La, Ta, and/or Ti, but is not limited thereto. In some example embodiments, the dielectric layer 140 may have a single layered structure formed of $HfO_2$. In some example embodiments, the dielectric layer 140 may have a multi-layered structure including an $HfO_2$ layer contacting the lower electrode structure LE1 and at least one high-k dielectric layer spaced apart from the lower electrode structure LE1 with the $HfO_2$ layer therebetween. The at least one high-k dielectric layer may include at least one of a $ZrO_2$ layer, an $Al_2O_3$ layer, a $CeO_2$ layer, a $La_2O_3$ layer, a $Ta_2O_3$ layer, or a $TiO_2$ layer.

The main electrode part 134 may act as a crystallization-inducing layer of the dielectric layer 140. For example, when the main electrode part 134 is formed of Nb oxide, Nb nitride, Nb oxynitride, or a combination thereof and the dielectric layer 140 includes an $HfO_2$ layer contacting the main electrode part 134, the main electrode part 134 may induce the $HfO_2$ layer to have a preferred orientation of tetragonal phase. A part of the dielectric layer 140 contacting at least the main electrode part 134 may maintain a crystal structure of tetragonal phase. The $HfO_2$ layer having the tetragonal phase may have a higher dielectric constant than an $HfO_2$ layer having a monoclinic phase. As the dielectric layer 140 includes the $HfO_2$ layer with the tetragonal phase, an equivalent oxide thickness of the dielectric layer 140 may be lowered due to the $HfO_2$ layer having the relatively high dielectric constant. In addition, the $HfO_2$ layer may have a relatively high band value of about 5.68 eV. Therefore, a potential barrier between the lower electrode structure LE1 and the dielectric layer 140 may rise, and thus an oxygen atom in the dielectric layer 140 may be suppressed from moving into the lower electrode structure LE1 such that degradation of electrical characteristics of the dielectric layer 140 may be prevented or reduced in likelihood of occurrence, leakage current in the capacitor CP1 may be inhibited or reduced in occurrence, and a relatively high capacitance may be provided.

The upper electrode 150 may be opposite to the lower electrode structure LF1 with the dielectric layer 140 therebetween. The upper electrode 150 may include metal, metal nitride, metal oxide, or a combination thereof. For example, the upper electrode 150 may include TiN, MoN, CoN, TaN, TiAlN, TaAlN, W, Ru, $RuO_2$, $SrRuO_3$, Ir, $IrO_2$, Pt, PtO, SRO($SrRuO_3$), BSRO(($Ba,Sr)RuO_3$), CRO($CaRuO_3$), LSCO(($La,Sr)CoO_3$), or a combination thereof.

Figure 4:
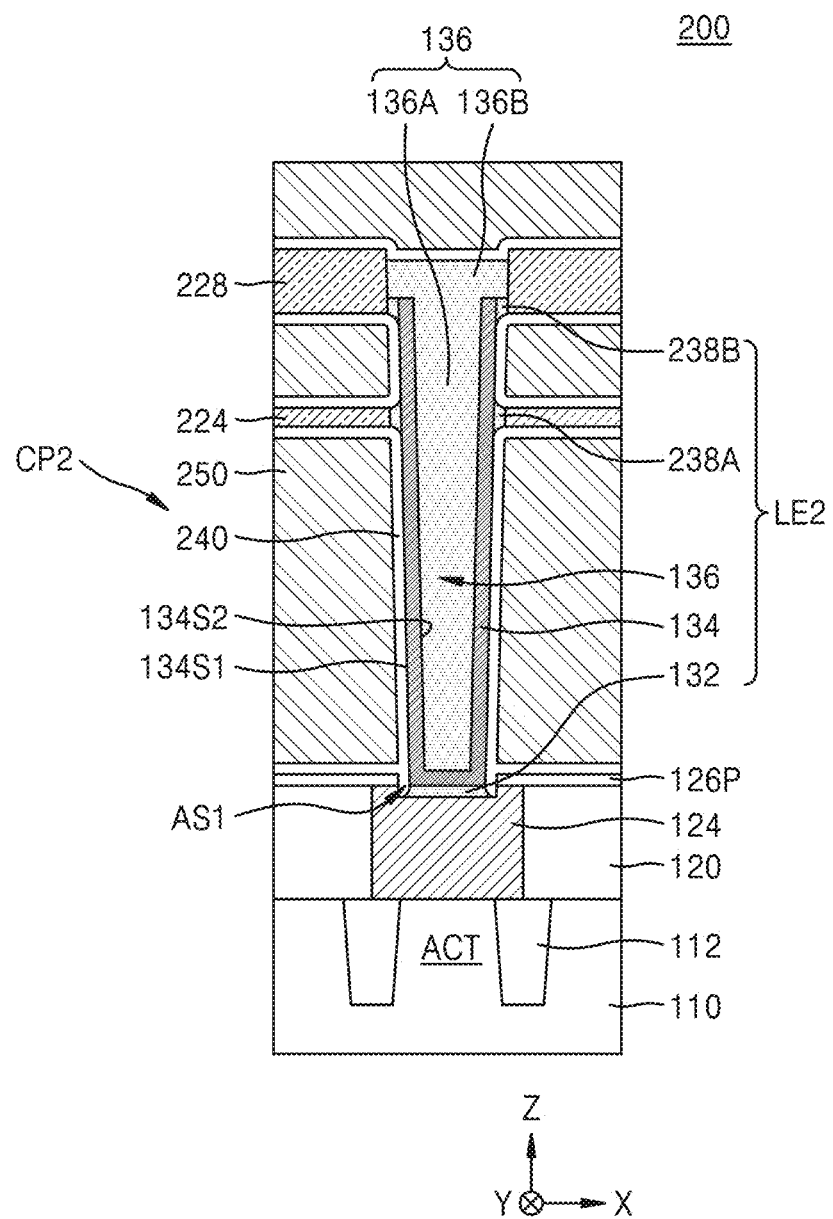
FIGS. 4 and 5 are cross-sectional views illustrating a portion of an integrated circuit device according to some example embodiments of inventive concepts.

FIG. 4 is a cross-sectional view illustrating a portion of an integrated circuit device according to some example embodiments of inventive concepts.

Referring to FIG. 4, an integrated circuit device 200 may correspond to a portion of the integrated circuit device 10 of FIG. 1. The integrated circuit device 200 may have substantially the same configuration as the integrated circuit device 100 of FIGS. 2 and 3. The integrated circuit device 200 may include a capacitor CP2 including a lower electrode structure LE2, an upper electrode 250, and a dielectric layer 240 between the lower electrode structure LE2 and the upper electrode 250. At least one supporting layer for supporting the lower electrode structure LE2 may be disposed around the lower electrode structure LE2. The at least one supporting layer may include a first supporting layer 224 and a second supporting layer 228. The lower electrode structure LE2 may correspond to the lower electrode structure LE of FIG. 1. In FIG. 4, two supporting layers including the first supporting layer 224 and the second supporting layer 228 are illustrated, but inventive concepts are not limited thereto. For example, the integrated circuit device 200 may include one supporting layer or three or more supporting layers sequentially stacked along the vertical direction (Z direction).

The lower electrode structure LE2 may have substantially the same structure as the lower electrode structure LE1 described with reference to FIGS. 2 and 3. However, the lower electrode structure LE2 may further include a plurality of protrusion electrode parts 238A and 238B extending from an outer sidewall 134S1 of the main electrode part 134 toward the first supporting layer 224 and the second supporting layer 228 in a horizontal direction. The plurality of protrusion electrode parts 238A and 238B may include the same material as the bridge electrode part 132. The plurality of protrusion electrode parts 238A and 238B may radially extend outward from the outer sidewall 134S1 of the main electrode part 134. In the lower electrode structure LE2, the bridge electrode part 132, the capping electrode part 136, and the plurality of protrusion electrode parts 238A and 238B may include the same material.

Each of the first supporting layer 224 and the second supporting layer 228 may support the lower electrode structure LE2 at a location spaced apart from the main electrode part 134. The plurality of protrusion electrode parts 238A and 238B may be interposed between the main electrode part 134 and respective ones of the first and second supporting layers 224 and 228. The first supporting layer 224 and the second supporting layer 228 may include silicon nitride, silicon carbonitride, tantalum oxide, titanium oxide, or a combination thereof. A thicknesses of the first supporting layer 224 may be different from a thickness of the second supporting layer 228 in the vertical direction (Z direction) as shown in FIG. 4, but inventive concepts are not limited thereto.

The dielectric layer 240 may conformally cover an outer sidewall of the lower electrode structure LE2, a lower surface and an upper surface of each of the first supporting layer 224 and the second supporting layer 228, and an upper surface of the insulation pattern 126P. The dielectric layer 240 may include a part filling the ring-shaped space AS1 between the sidewall of the insulation pattern 126P defining the opening 126H and the bridge electrode part 132. The dielectric layer 240 may include a part contacting the outer sidewall 134S1 of the main electrode part 134, a part contacting a sidewall of the bridge electrode part 132, a part contacting the capping electrode part 136, and a part contacting each of the plurality of protrusion electrode parts 238A and 238B. The upper electrode 250 may include a part opposite to the lower electrode part LE2 with the dielectric layer 240 therebetween and parts opposite to the first supporting layer 224 and the second supporting layer 228 with the dielectric layer 240 therebetween. The dielectric layer 240 and the upper electrode 250 may be substantially the same as the dielectric layer 140 and the upper electrode 150 described with reference to FIG. 3.

Figure 5:
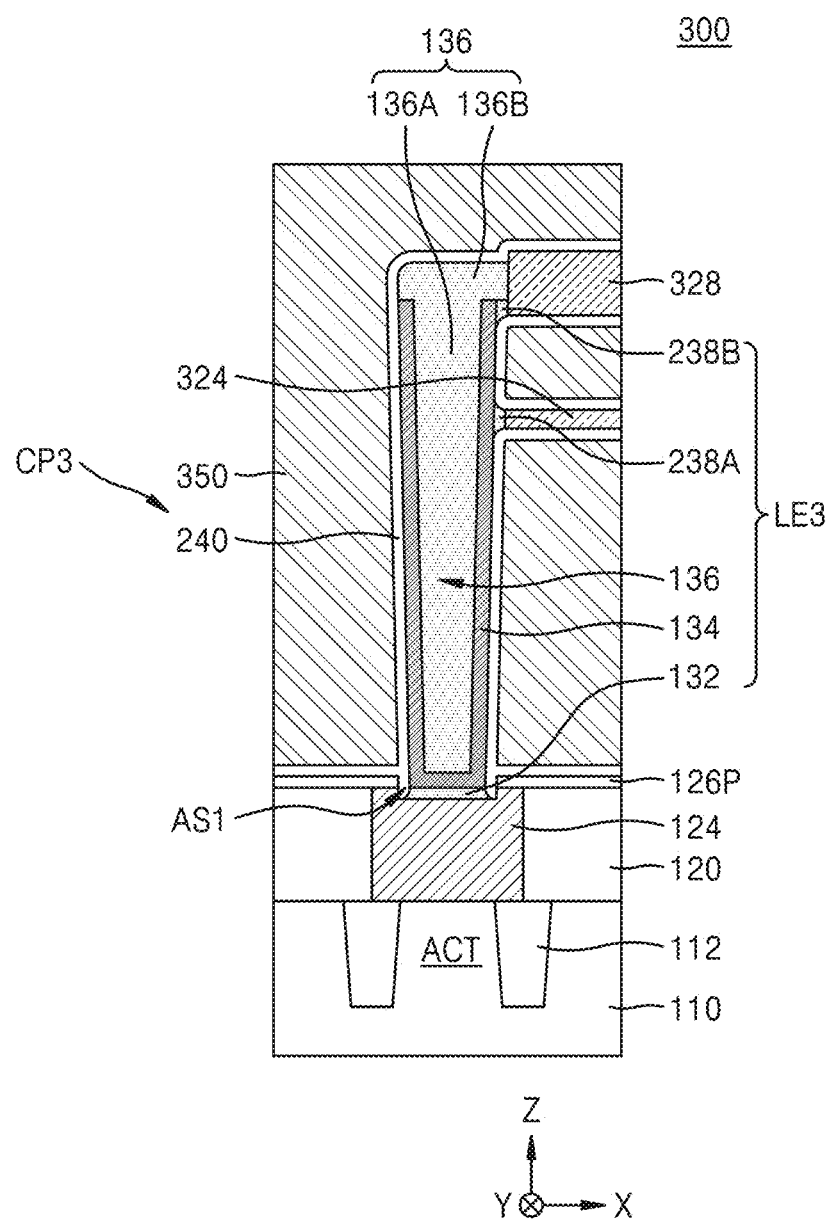

FIG. 5 is a cross-sectional view illustrating a portion of an integrated circuit device according to some example embodiments of inventive concepts.

Referring to FIG. 5, an integrated circuit device 300 may include a capacitor CP3 including a lower electrode structure LE3, an upper electrode 350, and the dielectric layer 240 between the lower electrode structure LE3 and the upper electrode 350. A first supporting layer 324 and a second supporting layer 328 may be disposed around the lower electrode structure LE3 to support the lower electrode structure LE3. The lower electrode structure LE3 may correspond to the lower electrode structure LE of FIG. 1.

The lower electrode structure LE3, the first supporting layer 324, and the second supporting layer 328 may have substantially the same structure as the lower electrode structure LE2, the first supporting layer 224, and the second supporting layer 228 described with reference to FIG. 4. However, in the integrated circuit device 300, the first supporting layer 324 and the second supporting layer 328 may contact the lower electrode structure LE3 at only one side of the lower electrode structure LE3, when viewed in a cross-section view taken along X-Z plane as shown in FIG. 5. The plurality of protrusion electrode parts 238A and 238B may extend in the horizontal direction between the main electrode part 134 and the first supporting layer 224 and between the main electrode part 134 and the second supporting layer 228, respectively.

Figure 6:
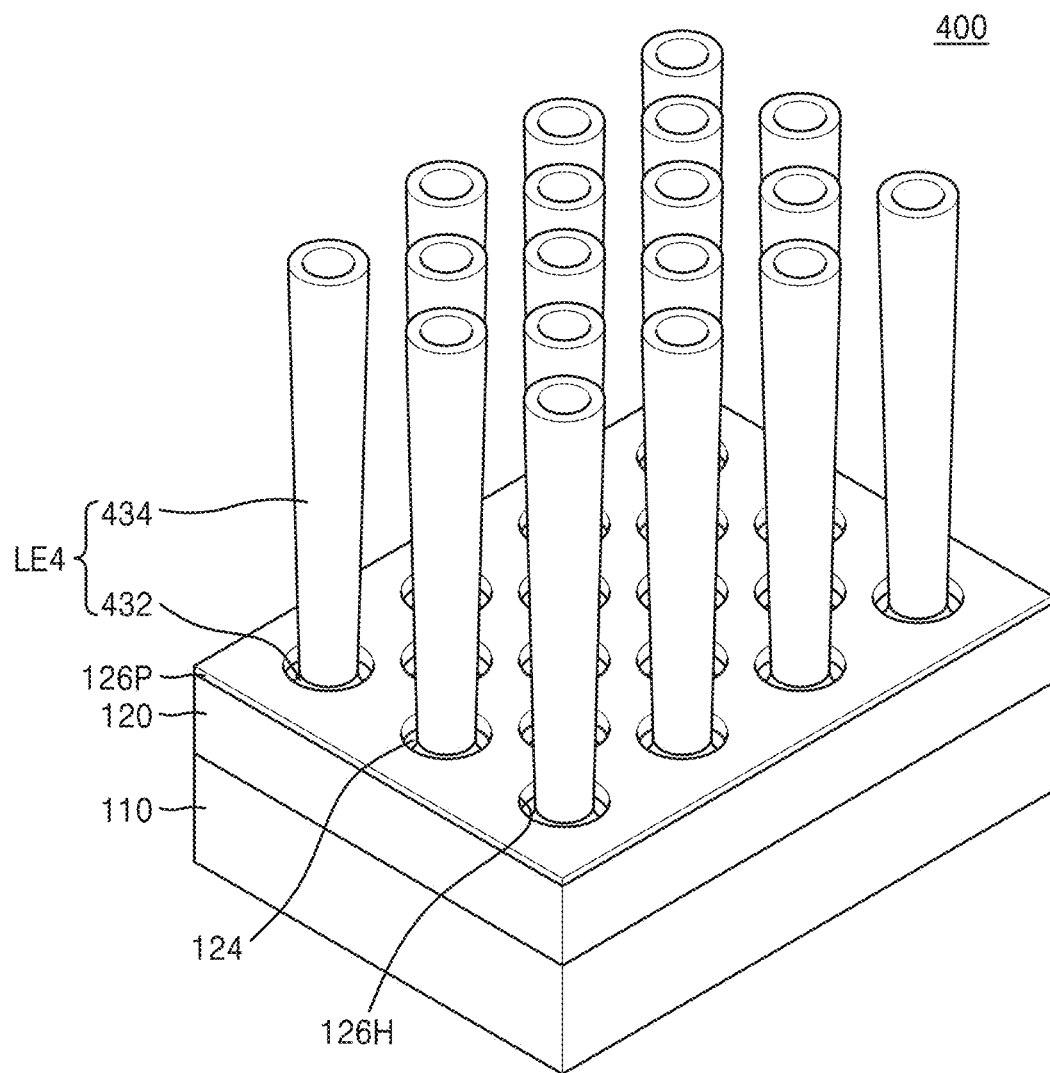
FIG. 6 is a perspective view illustrating a portion of an integrated circuit device according to some example embodiments of inventive concepts.
Figure 7:
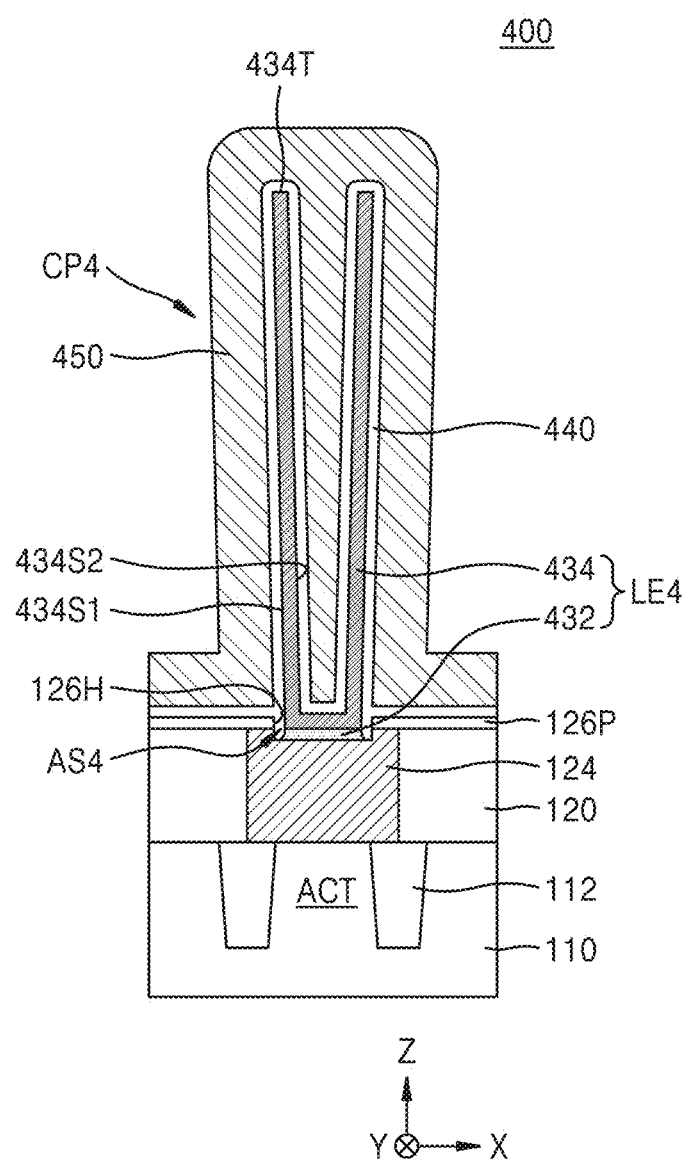
FIG. 7 is a cross-sectional view illustrating a portion of the integrated circuit of FIG. 6 according to some example embodiments of inventive concepts.

FIG. 6 is a perspective view illustrating a portion of an integrated circuit device according to some example embodiments of inventive concepts. FIG. 7 is a cross-sectional view illustrating a portion of the integrated circuit of FIG. 6 according to some example embodiments of inventive concepts.

Referring to FIGS. 6 and 7, an integrated circuit device 400 may correspond to a portion of the integrated circuit device 10 of FIG. 1. In FIGS. 6 and 7, some elements of the integrated circuit device 400 are omitted or are simply illustrated. However, the configurations of the integrated circuit device 400 are not limited to those shown in FIGS. 6 and 7 and may include characteristic configuration elements as will described below.

The integrated circuit device 400 may have substantially the same configuration as the integrated circuit device 100 of FIGS. 2 and 3. The integrated circuit device 400 may include a capacitor CP4 including a lower electrode structure LE4, an upper electrode 450, and a dielectric layer 440 between the lower electrode structure LE4 and the upper electrode 450. The lower electrode structure LE4 may correspond to the lower electrode structure LE of FIG. 1.

The lower electrode structure LE4 may have a structure substantially similar to the lower electrode structure LE1 described with reference to FIGS. 2 and 3, except for not including the capping electrode part 136. The lower electrode structure LE4 may include a bridge electrode part 432 and a main electrode part 434. The bridge electrode part 432 and the main electrode part 434 may have substantially the same structure as the bridge electrode part 132 and the main electrode part 134, respectively, of FIG. 3. The main electrode part 434 may have an outer sidewall 434S1, an inner sidewall 434S2 defining an internal space of the main electrode part 434, and an uppermost surface 434T farthest from the substrate 110.

The dielectric layer 440 may include a part interposed between the lower electrode structure LE4 and the upper electrode 450 and a part interposed between the insulation pattern 126P and the upper electrode 450. The dielectric layer 240 may include a part filling a ring-shaped space AS4 defined by the sidewall of the insulation pattern 126P defining the opening 126H and the bridge electrode part 432. The dielectric layer 440 may include a part contacting the outer sidewall 434S1 of the main electrode part 434, a part contacting the inner sidewall 434S2 of the main electrode part 434 in the internal space of the main electrode part 434, and a part contacting a sidewall of the bridge electrode part 432. A part of the upper electrode 450 may be disposed in the internal space of the main electrode part 434 and may be opposite to the inner sidewall 434S2 of the main electrode part 434 with the dielectric layer 440 therebetween. The dielectric layer 440 and the upper electrode 450 may be substantially the same as the dielectric layer 140 and the upper electrode 150, respectively, described with reference to FIG. 3.

Figure 8:
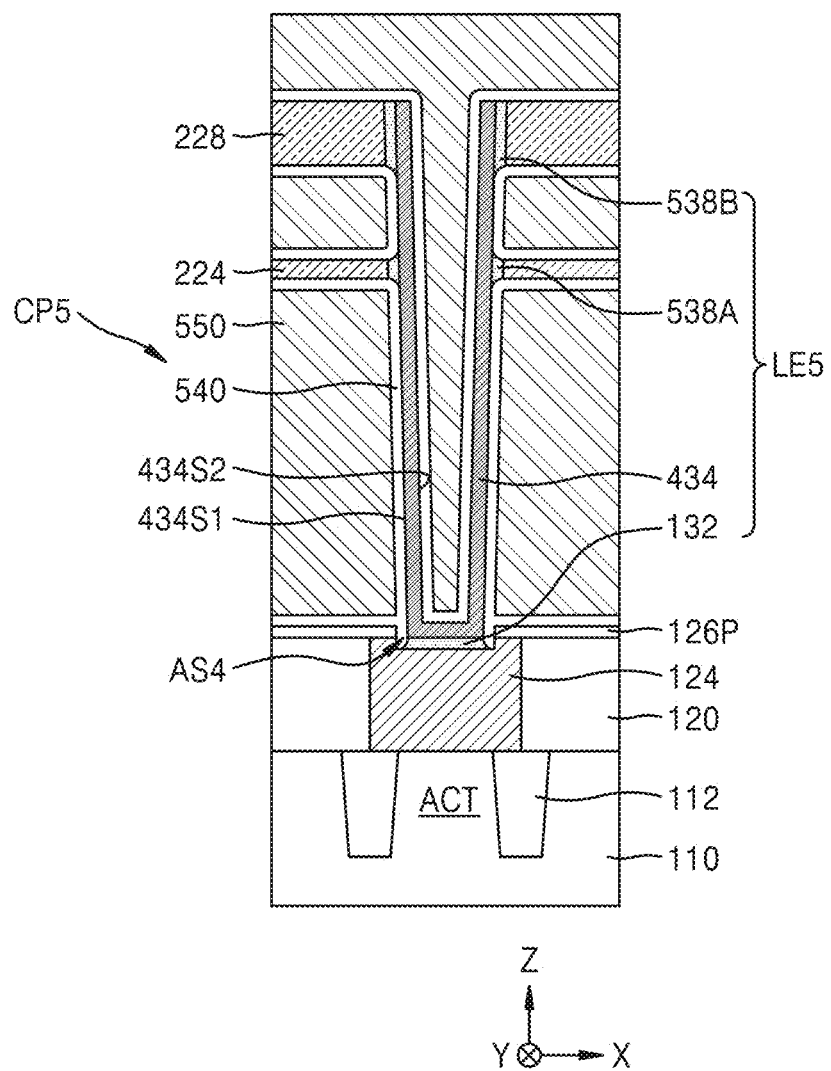
FIGS. 8, 9, and 10 are cross-sectional views illustrating a portion of an integrated circuit device according to some example embodiments of inventive concepts.

FIG. 8 is a cross-sectional view illustrating a portion of an integrated circuit device according to some example embodiments of inventive concepts.

Referring to FIG. 8, an integrated circuit device 500 may correspond to a portion of the integrated circuit device 10 of FIG. 1. The integrated circuit device 500 may have substantially the same configuration as the integrated circuit device 400 of FIGS. 6 and 7. The integrated circuit device 500 may include a capacitor CP5 including a lower electrode structure LE5, an upper electrode 550, and a dielectric layer 540 between the lower electrode structure LE5 and the upper electrode 550. The first supporting layer 224 and the second supporting layer 228 may be disposed around the lower electrode structure LE5 to support the lower electrode structure LE5. The lower electrode structure LE5 may correspond to the lower electrode structure LE of FIG. 1. The first supporting layer 224 and the second supporting layer 228 may be the same as described with reference to FIG. 4.

The lower electrode structure LE5 may have substantially the same structure as the lower electrode structure LE4 as described with reference to FIG. 7. The lower electrode structure LE5 may further include a plurality of protrusion electrode parts 538A and 538B extending from the main electrode part 434 toward the first supporting layer 224 and the second supporting layer 228 in a horizontal direction. Each of the plurality of protrusion electrode parts 538A and 538B may radially extend outward from the outer sidewall 434S1 of the main electrode part 434. In the lower electrode structure LE5, the bridge electrode part 132 and the plurality of protrusion electrode parts 538A and 538B may include the same material. The plurality of protrusion electrode parts 538A and 538B may be the same as, e.g. correspond to, the plurality of protrusion electrode parts 238A and 238B of FIG. 4. Each of the first supporting layer 224 and the second supporting layer 228 may support the lower electrode structure LE5 at a location spaced apart from the main electrode part 434.

In some example embodiments, similar to the integrated circuit device 300 described with reference to FIG. 5, in the integrated circuit device 500, the first supporting layer 224 and the second supporting layer 228 may contact the lower electrode structure LE5 at only one side of the lower electrode structure LE5, when viewed in a cross-section view taken along X-Z plane as shown in FIG. 8.

The dielectric layer 540 may conformally cover an outer sidewall of the lower electrode structure LE5, a lower surface and an upper surface of each of the first supporting layer 224 and the second supporting layer 228, and an upper surface of the insulation pattern 126P. The dielectric layer 540 may include a part filling the ring-shaped space AS4. The dielectric layer 540 may include a part contacting the outer sidewall 434S1 of the main electrode part 434, a part contacting the inner sidewall 434S2 of the main electrode part 434 in the internal space of the main electrode part 434, and a part contacting a sidewall of the bridge electrode part 132. A part of the upper electrode 550 may be disposed in the internal space of the main electrode part 434 and may be opposite to the inner sidewall 434S2 of the main electrode part 434 with the dielectric layer 540 therebetween. The dielectric layer 540 and the upper electrode 550 may be substantially the same as the dielectric layer 140 and the upper electrode 150, respectively, described with reference to FIG. 3.

Figure 9:
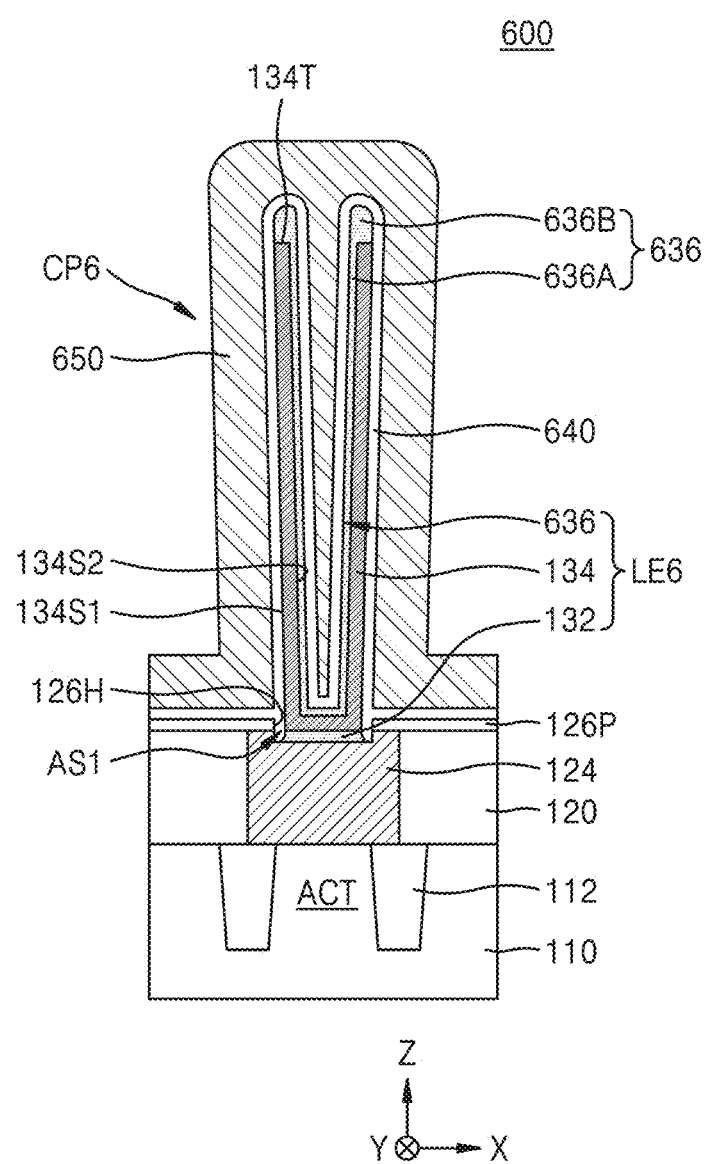

FIG. 9 is a cross-sectional view illustrating a portion of an integrated circuit device according to some example embodiments of inventive concepts.

Referring to FIG. 9, an integrated circuit device 600 may be a portion of the integrated circuit device 10 of FIG. 1. The integrated circuit device 600 may have substantially the same configuration as the integrated circuit device 100 of FIG. 3. The integrated circuit device 600 may include a capacitor CP6 including a lower electrode structure LE6, an upper electrode 650, and a dielectric layer 640 between the lower electrode structure LE6 and the upper electrode 650. The lower electrode structure LE6 may correspond to the lower electrode structure LE of FIG. 1.

The lower electrode structure LE6 may include the bridge electrode part 132 and the main electrode part 134, and the capping electrode part 636. The capping electrode part 636 may extend long in the vertical direction (Z direction), from the internal space of the main electrode part 134 to a location outside the internal space thereof. The capping electrode part 636 may contact the inner sidewall 134S2 of the main electrode part 134 and may fill a portion of the internal space of the main electrode part 134. The capping electrode part 636 may include a first part 636A that fills a portion of the internal space of the main electrode part 134 and a second part 636B that is integrally coupled to the first part 636A, protrudes from the first part 636A in a direction extending away from the substrate 110, and covers the uppermost surface 134T of the main electrode part 134.

The dielectric layer 640 may include a part interposed between the lower electrode structure LE6 and the upper electrode 650, a part interposed between the insulation pattern 126P and the upper electrode 650, and a part filling the ring-shaped space AS1. The dielectric layer 640 may include a part contacting the outer sidewall 134S1 of the main electrode part 134, a part contacting the first part 636A of the capping electrode part 636 in the internal space of the main electrode part 134, and a part contacting a sidewall of the bridge electrode part 132. A part of the upper electrode 650 may be disposed in the internal space of the main electrode part 134 and may be opposite to the inner sidewall 134S2 of the main electrode part 134 with the dielectric layer 640 therebetween. The dielectric layer 640 and the upper electrode 650 may be substantially the same as the dielectric layer 140 and the upper electrode 150, respectively, described with reference to FIG. 3.

Figure 10:
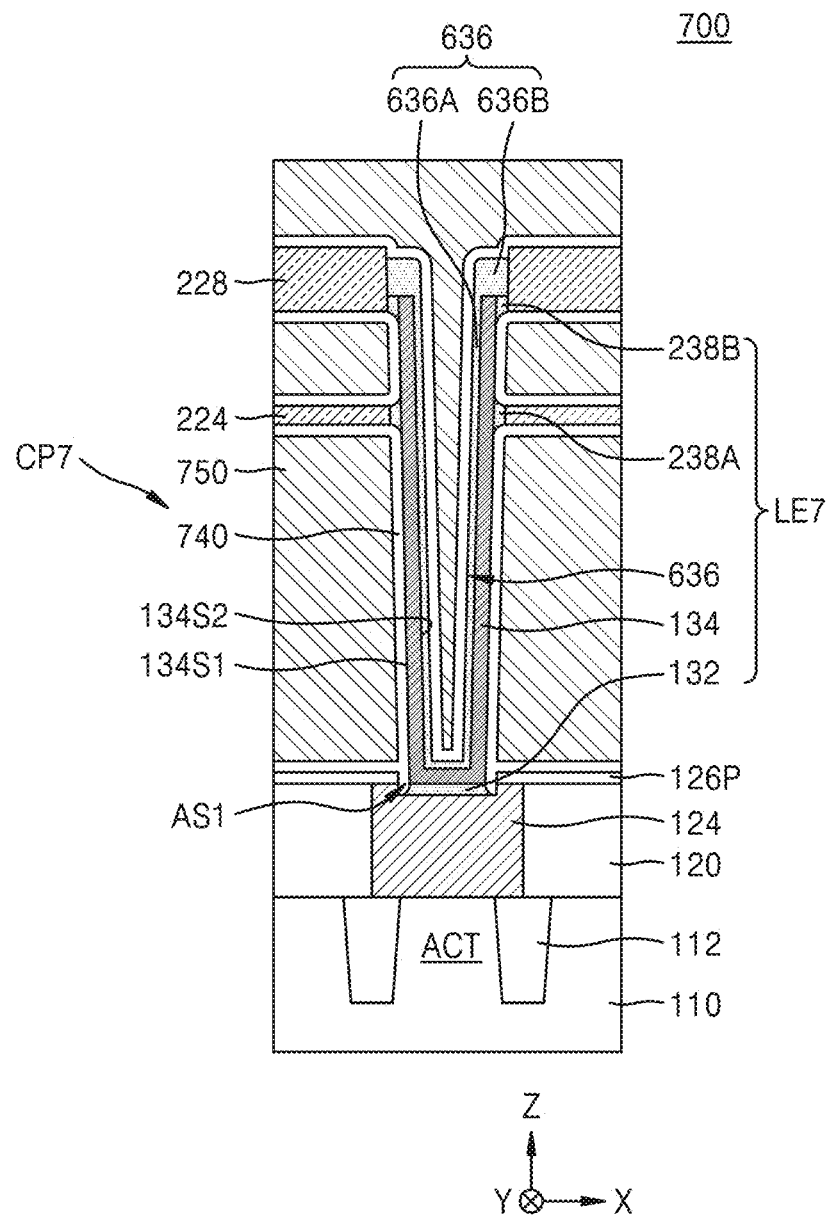

FIG. 10 is a cross-sectional view illustrating a portion of an integrated circuit device according to some example embodiments of inventive concepts.

Referring to FIG. 10, an integrated circuit device 700 may correspond to a portion of the integrated circuit device 10 of FIG. 1. The integrated circuit device 700 may have substantially the same configuration as the integrated circuit device 600 of FIG. 9. The integrated circuit device 700 may include a capacitor CP7 including a lower electrode structure LE7, an upper electrode 750, and a dielectric layer 740 between the lower electrode structure LE7 and the upper electrode 750. The first supporting layer 224 and the second supporting layer 228 may be disposed around the lower electrode structure LE7 to support the electrode structure LE7. The lower electrode structure LE7 may correspond to the lower electrode structure LE of FIG. 1. In FIG. 10, two supporting layers including the first supporting layer 224 and the second supporting layer 228 are illustrated, but inventive concepts are not limited thereto. For example, the integrated circuit device 700 may include one supporting layer or three or more supporting layers sequentially stacked along the vertical direction (Z direction).

The lower electrode structure LE7 may have substantially the same structure as the lower electrode structure LE6 as described with reference to FIG. 9. The lower electrode structure LE7 may further include a plurality of protrusion electrode parts 238A and 238B extending from the outer sidewall 134S1 of the main electrode part 134 toward the first supporting layer 224 and the second supporting layer 228 in a horizontal direction. The plurality of protrusion electrode parts 238A and 238B may be the same as described with reference to FIG. 4. The first supporting layer 224 and the second supporting layer 228 may the same as described with reference to FIG. 3.

The dielectric layer 740 may conformally cover an outer sidewall of the lower electrode structure LE7, a lower surface and an upper surface of each of the first supporting layer 224 and the second supporting layer 228, and an upper surface of the insulation pattern 126P. The dielectric layer 740 may include a part interposed between the lower electrode structure LE7 and the upper electrode 750, a part interposed between the insulation pattern 126P and the upper electrode 750, and a part filling the ring-shaped space AS1. The dielectric layer 740 may include a part contacting the outer sidewall 134S1 of the main electrode part 134, a part contacting the first part 636A of the capping electrode part 636 in the internal space of the main electrode part 134, and a part contacting a sidewall of the bridge electrode part 132. A part of the upper electrode 750 may be disposed in the internal space of the main electrode part 134 and may be opposite to the inner sidewall 134S2 of the main electrode part 134 with the dielectric layer 740 therebetween. The dielectric layer 740 and the upper electrode 750 may be substantially the same as the dielectric layer 140 and the upper electrode 150, respectively, described with reference to FIG. 3.

According to the integrated circuit devices 100, 200, 300, 400, 500, 600, and 700 described with reference to FIGS. 2 to 10, the main electrode parts 134 and 434 may act as a crystallization-inducing layer to induce the dielectric layers 140, 240, 440, 540, 640, and 740 to have the preferred orientation of tetragonal phase. Therefore, the parts of the dielectric layers 140, 240, 440, 540, 640, and 740 contacting at least the main electrode parts 134 and 434 maintain the crystal structure of the tetragonal phase to have a relatively high dielectric constant, and thus the thickness of the equivalent oxide of the dielectric layers 140, 240, 440, 540, 640, and 740 may be lowered, i.e., the dielectric constant of the dielectric layers 140, 240, 440, 640, and 740 may be increased, increasing a capacitance of the respective capacitors CP1, CP2, CP3, CP4, CP5, CP6, and CP7. In addition, the potential barrier between each of the lower electrode structures LE1, LE2, LE3, LE4, LE5, LE6, and LE7 and a corresponding one of the dielectric layers 140, 240, 440, 540, 640, and 740 is raised, thus preventing the degradation of the electrical characteristics of the dielectric layers 140, 240, 440, 540, 640, and 740, inhibiting the leakage current generation in the capacitors CP1, CP2, CP3, CP4, CP5, CP6, and CP7, and providing the relatively high capacitance thereto.

FIGS. 11A to 11M are cross-sectional views of stages in a method of manufacturing an integrated circuit device according to some example embodiments of inventive concepts. An example method of manufacturing the integrated circuit device 100 of FIG. 3 will be described with reference to FIGS. 11A to 11M.

Figure 11A:
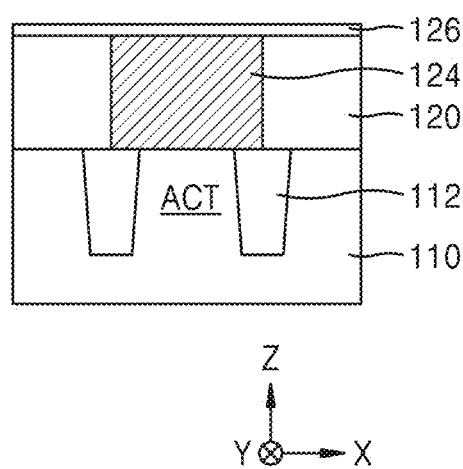
FIGS. 11A to 11M are cross-sectional views of stages in a method of manufacturing an integrated circuit device according to some example embodiments of inventive concepts.

Referring to FIG. 11A, the lower structure 120 and the conductive region 124 may be formed on the substrate 110 in which the active region ACT is defined by the isolation region 112. The conductive region 124 may pass through the lower structure 120 and may be connected to the active region ACT. An insulation layer 126 may be formed to cover the lower structure 120 and the conductive region 124.

The insulation layer 126 may be used as an etch stop layer in the subsequent process. The insulation layer 126 may be formed of or may include an insulation material having an etch selectivity with respect to the lower structure 120. In some example embodiments, the insulation layer 126 may include silicon nitride, silicon oxynitride, or a combination thereof. The insulation layer 126 may be formed with a chemical vapor deposition (CVD) process, for example, with a plasma-enhanced CVD (PECVD) process and/or a low-pressure CVD (LPCVD) furnace process; however, inventive concepts are not limited thereto.

Figure 11B:
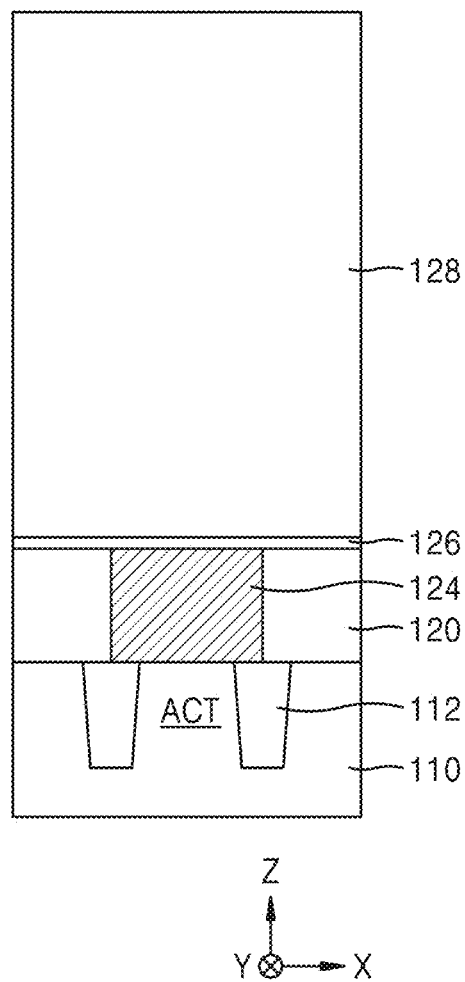

Referring to FIG. 11B, a mold layer 128 may be formed on the insulation layer 126.

The mold layer 128 may be formed of or may include an insulation material having an etch selectivity with respect to the insulation layer 126. The mold layer 128 may include an oxide layer, for example, a boro-phospho-silicate glass (BPSG) layer. The mold layer 128 may be formed with a chemical vapor deposition process, such an LPCVD process and/or a PECVD process; however, inventive concepts are not limited thereto.

Figure 11C:
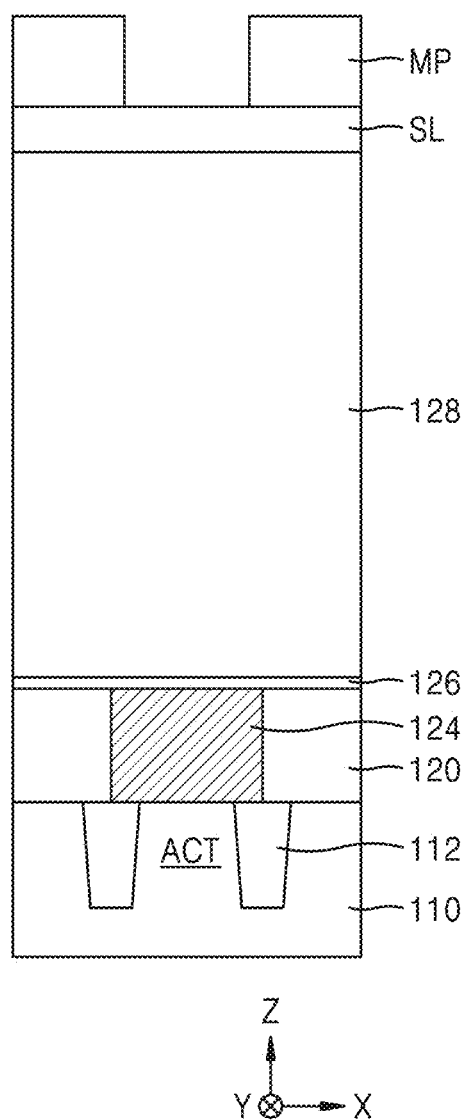

Referring to FIG. 11C, a sacrificial layer SL and a mask pattern MP may be sequentially formed on the mold layer 128.

The sacrificial layer SL may be formed of or may include an oxide layer. The mask pattern MP may be formed of or may include a nitride layer, an oxide layer, a polysilicon layer, a photoresist layer, or a combination thereof. A patterning process (not shown) such as a photolithography process may be used to form trenches in the mask pattern MP.

Figure 11D:
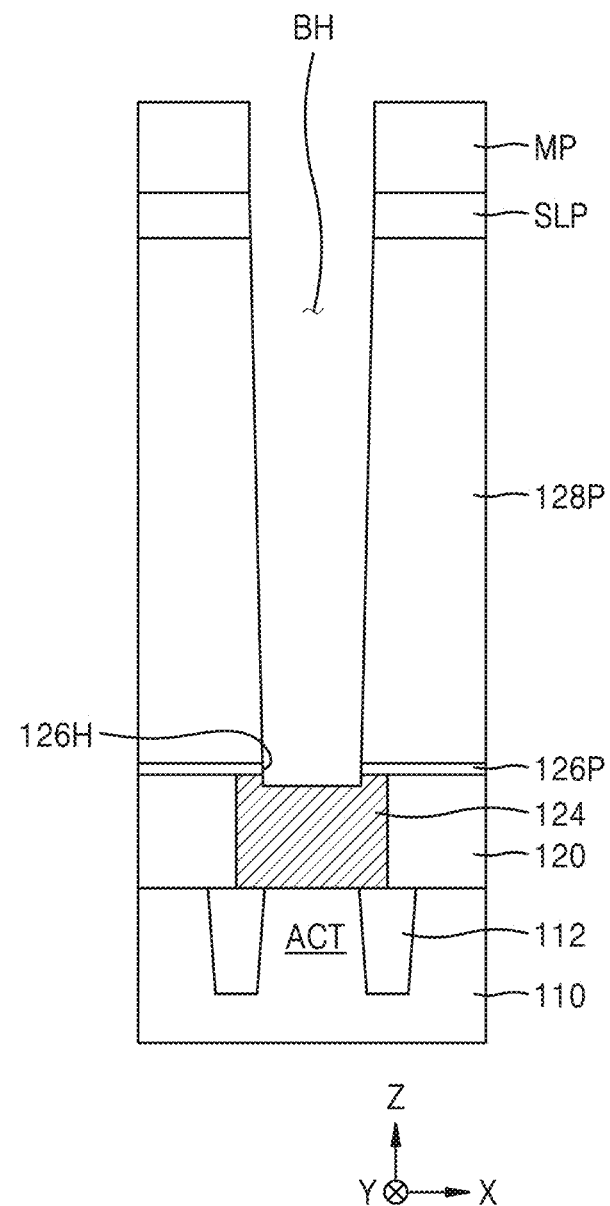

Referring to FIG. 11D, in the resulting structure of FIG. 11C, the sacrificial layer SL, the mold layer 128, and the insulation layer 126 may be anisotropically etched by using the mask pattern MP as an etch mask and using the insulation layer 126 as an etch stop layer, such that a sacrificial pattern SLP defining a hole BH, a mold pattern 128P, and the insulation pattern 126P may be formed. The opening 126H may be formed in the insulation pattern 126P to expose the conductive region 124. While the hole BH is formed by the anisotropic etch, a portion of the upper portion of the conductive region 124 may be over-etched.

Figure 11E:
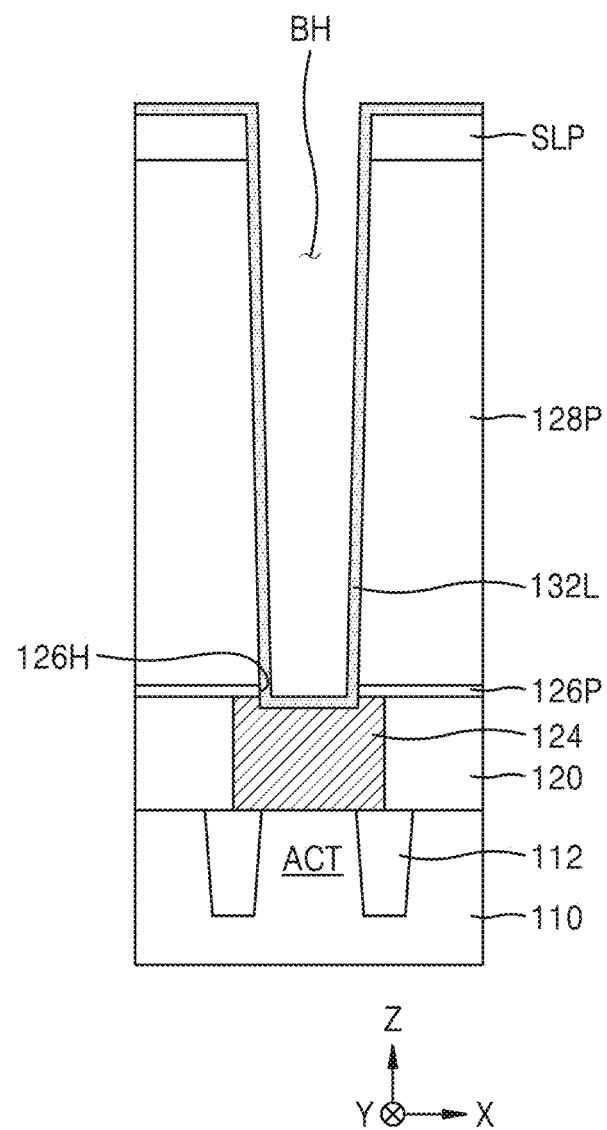

Referring to FIG. 11E, after removing the mask pattern MP from the resulting structure of FIG. 11D, a preliminary bridge electrode layer 132L may be formed along a surface of the conductive region 124, a surface of the insulation pattern 126P, a surface of the mold pattern 128P, a surface of the sacrificial pattern SLP that are exposed by the hole BH. The preliminary bridge electrode layer 132L may conformally cover an inner surface of the hole BH. After the preliminary bridge electrode layer 132L is formed, a portion of the hole BH may remain empty.

A material for forming the preliminary bridge electrode layer 132L may be the same as the material of the bridge electrode part 132 described with reference to FIG. 3. The preliminary bridge electrode layer 132L may be formed using a chemical vapor deposition (CVD) process, a metal organic CVD process, or an atomic layer deposition (ALD) process.

Figure 11F:
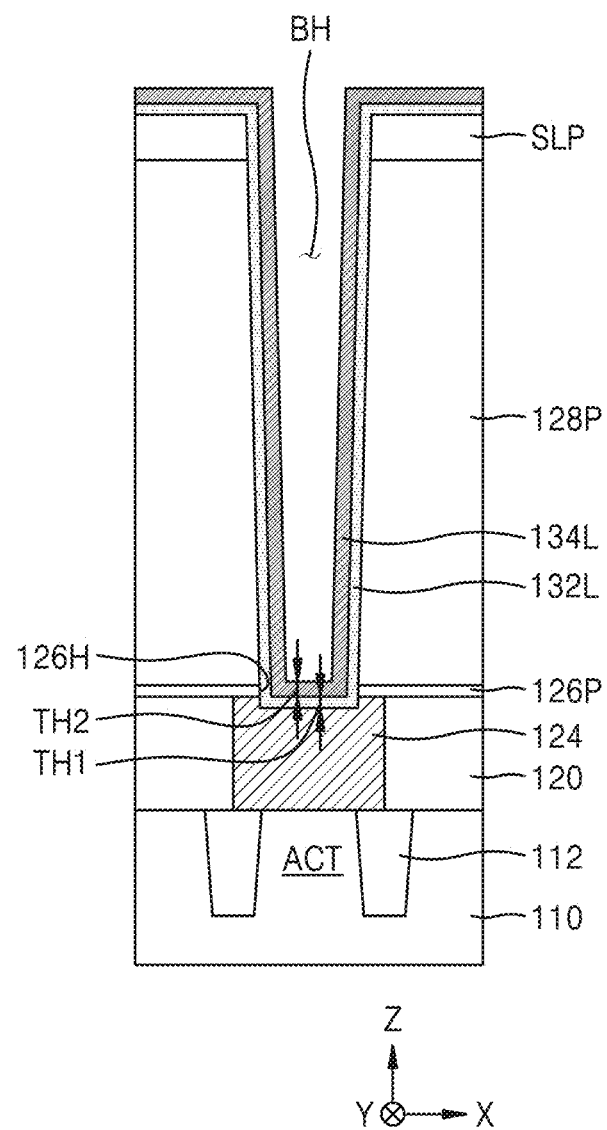

Referring to FIG. 11F, a main electrode layer 134L may be conformally formed in the hole BH having the preliminary bridge electrode layer 132L.

A material for forming the main electrode layer 134L may be the same as the material of the main electrode part 134 described with reference to FIG. 3. The main electrode layer 134L may be formed using an ALD process. In some example embodiments, in the ALD process for forming the main electrode layer 134L, an organometallic compound containing an Nb center atom as an Nb precursor and at least one organic ligand coupled to the Nb center atom may be used. The organic ligand may contain a cyclopentadienyl group, a saturated or unsaturated hydrocarbon group of C1~C10, or an organic amine of C1~C10, but is not limited thereto. For example, the Nb precursor may be formed of or may include a compound represented by the formula Nb (NRR')$_5$, a compound represented by the formula (NRR')$_3$ Nb=NR", or a combination thereof. In the above formulas, R, R', and R" may each be an alkyl group, an alkenyl group, a cycloalkyl group, a cycloalkenyl group, or an aryl group, of C1~C10.

In some example embodiments, to form the main electrode layer 134L, the substrate 110 on which the preliminary bridge electrode layer 132L is formed may be loaded in a reaction chamber maintained at a temperature of about 100~600° C. and an ALD process cycle of alternately supplying the Nb precursor and a reaction gas on the substrate 110 may be performed a plurality of times.

To form an Nb nitride layer as the main electrode layer 134L, a reducing reaction gas may be used as the reaction gas. The reducing reaction gas may include $H_2$, $NH_3$, $GeH_4$, hydrazine ($N_2H_4$), a hydrazine derivative, or a combination thereof. The hydrazine derivative may include C1~C10 alkyl hydrazine, C1~C10 dialkyl hydrazine or a combination thereof.

To form an Nb oxide layer as the main electrode layer 134L, an oxidizing reaction gas may be used as the reaction gas. The oxidizing reaction gas may include $O_2$, $O_3$, $H_2O$, NO, $NO_2$, $N_2O$, $CO_2$, $H_2O_2$, HCOOH, $CH_3COOH$, $(CH_3CO)_2O$, plasma $O_2$, remote plasma $O_2$, plasma $N_2O$, plasma $H_2O$, or a combination thereof.

A first thickness TH1 of the preliminary bridge electrode layer 132L and a second thickness TH2 of the main electrode layer 134L may be variously selected. The first thickness TH1 and the second thickness TH2 may be the same or different. The second thickness TH1 may be less or greater than the first thickness TH1.

Figure 11G:
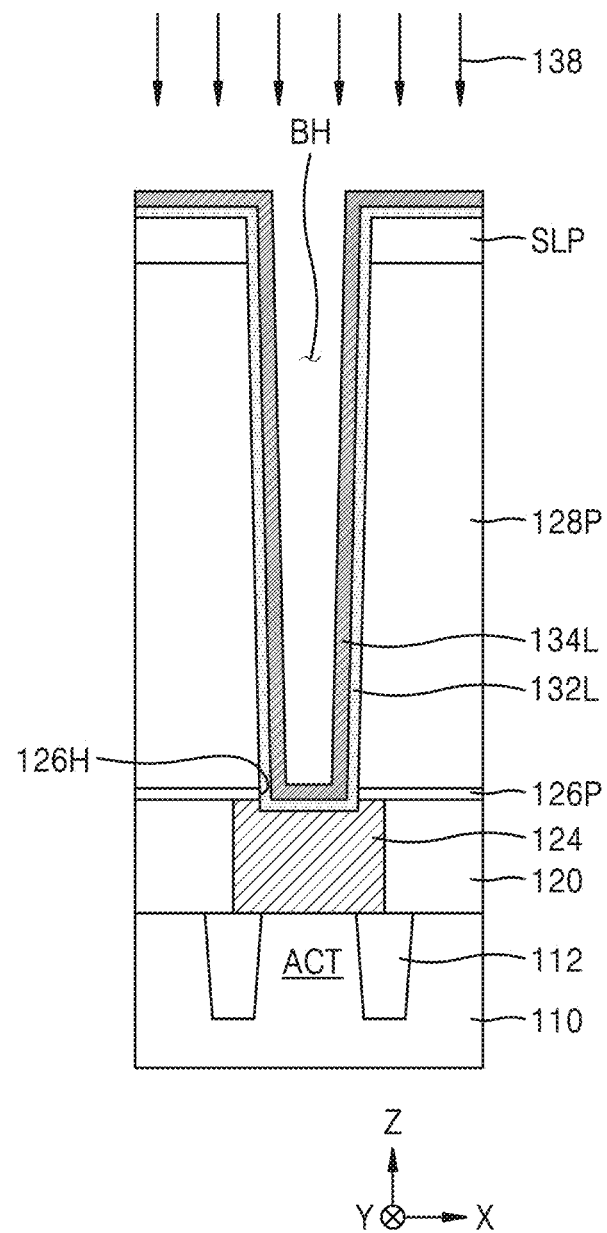

Referring to FIG. 11G, the main electrode layer 134L may be subject to plasma processing 138 in order to be densified.

In some example embodiments, to perform the plasma processing 138 on the main electrode layer 134L, the main electrode layer 134L may be exposed to a plasma environment obtained from a gas containing $NH_3$, $N_2$, $H_2$, Ar, He, or a combination thereof.

In the above process described with reference to FIG. 11F, impurities such as carbon may be included in the main electrode layer 134L as a result of using the metal precursor formed of the organometallic compound during the formation of the main electrode layer 134L. The impurities included in the main electrode layer 134L may be removed by the plasma processing 138 described with reference to FIG. 11G, such that the main electrode layer 134L may be densified and a resistance or resistivity of the main electrode layer 134L may be reduced.

In some example embodiments, the plasma processing 138 described with reference to FIG. 11G may be omitted.

Figure 11H:
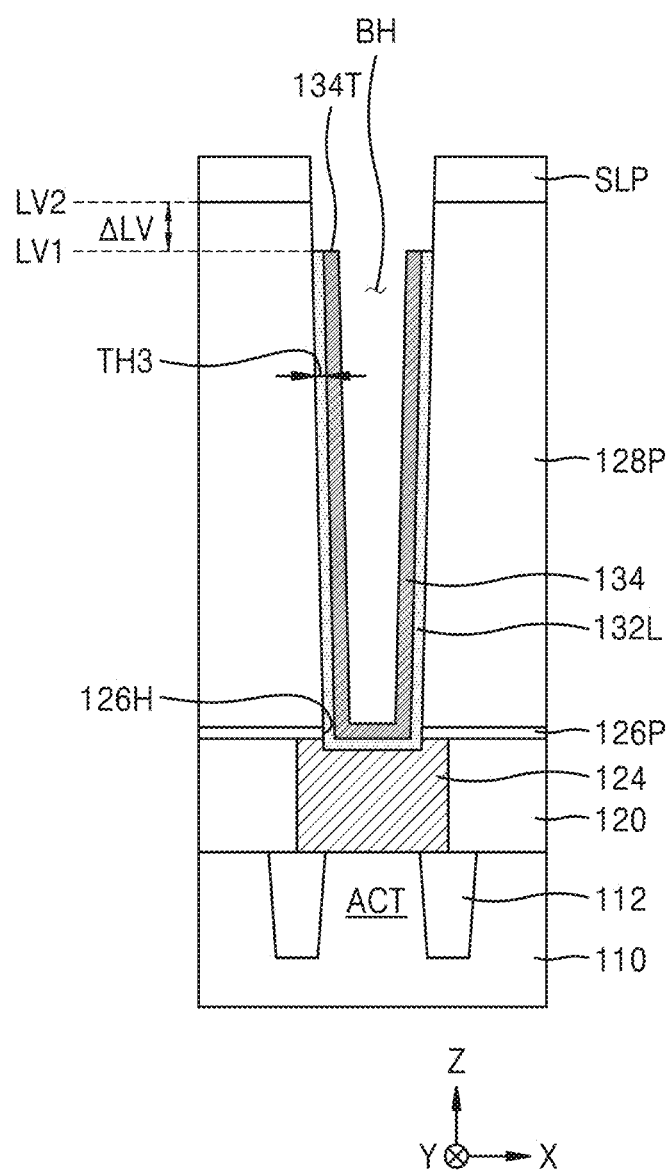

Referring to FIG. 11H, a portion of the upper portion of the main electrode layer 134L of the resulting structure of FIG. 11G may be removed by an etch-back process to form the main electrode part 134. A portion of the preliminary bridge electrode layer 132L may also be removed during the etch-back process of the main electrode layer 134L, such that a height of the preliminary bridge electrode layer 132L may be lowered. After the main electrode part 134 is formed, a space remaining on the main electrode part 134 among the hole BH may refer to an internal space of the main electrode part 134.

In some example embodiments, a first level LV1 of an uppermost surface 134T of the main electrode part 134 farthest from the substrate 110 may be closer to the substrate 110 than a second level LV2 of an uppermost surface of the mold pattern 128P farthest from the substrate 110. A difference ΔLV between the first level LV1 and the second level LV2 may be greater than a thickness TH3 of a portion of the preliminary bridge electrode layer 132L covering a sidewall of the main electrode part 134.

In some example embodiments, to form the main electrode part 134, a portion of the upper portion of the main electrode layer 134L and a portion of an upper portion of the preliminary bridge electrode layer 132L may be etched at the same time by dry etch. When the main electrode layer 134L is formed of Nb nitride, Nb oxide, Nb oxynitride, or a combination thereof, and the preliminary bridge electrode layer 132L is formed of TiN, the portion of the upper portion of the main electrode layer 134L and the portion of the upper portion of the preliminary bridge electrode layer 132L may be etched at the same time by a plasma etching process using an etch gas containing $Cl_2$, $BCl_3$, or a combination thereof.

Figure 11I:
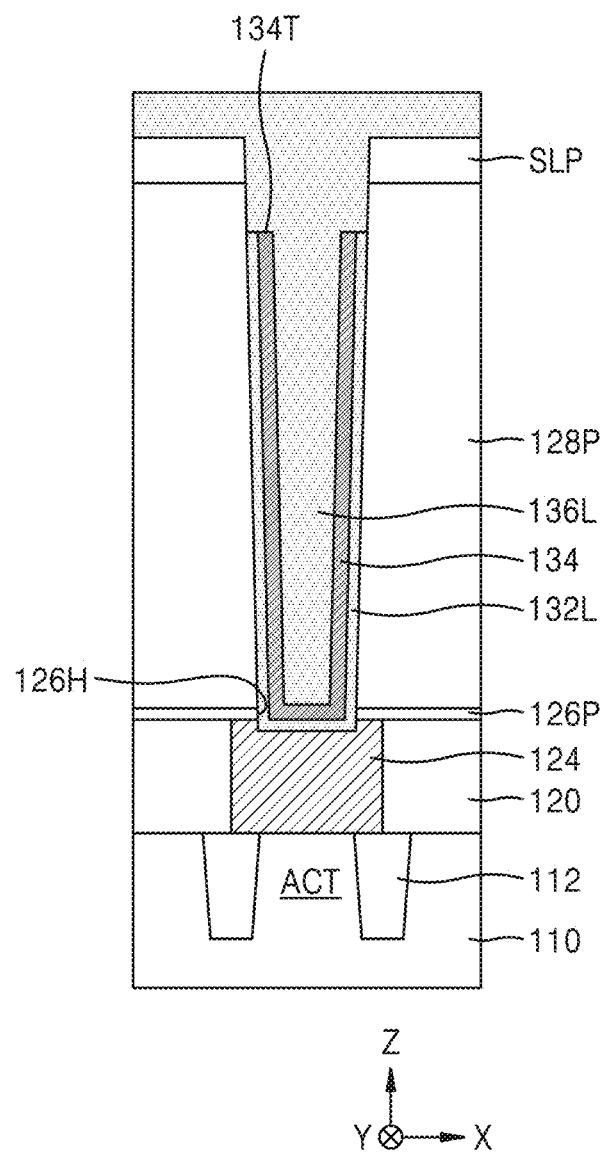

Referring to FIG. 11I, a capping electrode layer 136L may be formed to fill the inner space of the main electrode part 134 of the resulting structure of FIG. 11 and to cover the uppermost surface 134T of the main electrode part 134.

A material for forming the capping electrode layer 136L may be the same as the material of the capping electrode part 136 described with reference to FIG. 3. The capping electrode layer 136L may be formed by a CVD process, an MOCVD process, and/or an ALD process.

Figure 11J:
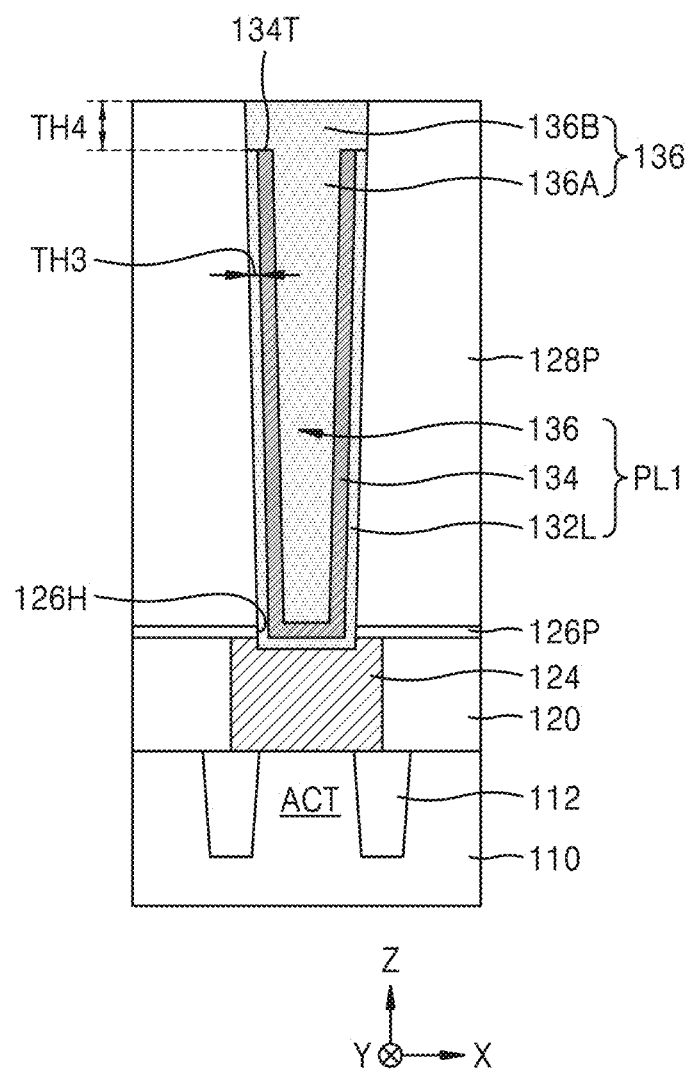

Referring to FIG. 11J, in the resulting structure of FIG. 11I, a portion of an upper portion of the capping electrode layer 136L and the sacrificial pattern SLP may be removed to form the capping electrode part 136 remaining in the hole BH. The capping electrode part 136 may include a first part 136A filling the inner space of the main electrode part 134 and a second part 136B covering the uppermost surface of the main electrode part 134.

To form the capping electrode part 136, a portion of the capping electrode layer 136L and the sacrificial pattern SLP may be removed by an etch back process and/or a chemical mechanical polishing (CMP) process until an upper surface of the mold pattern 128P of the resulting structure of FIG. 11I is exposed.

The preliminary bridge electrode layer 132L, the main electrode part 134, and the capping electrode part 136 may constitute, or be included in, a preliminary lower electrode structure PL1. In the preliminary lower electrode structure PL1, the main electrode part 134 may be completely covered by the preliminary bridge electrode layer 132L and the capping electrode part 136. A thickness TH4 of the second part 136B of the capping electrode part 136 may be greater than the thickness TH3 of the portion of the preliminary bridge electrode layer 132L covering the sidewall of the main electrode part 134.

Figure 11K:
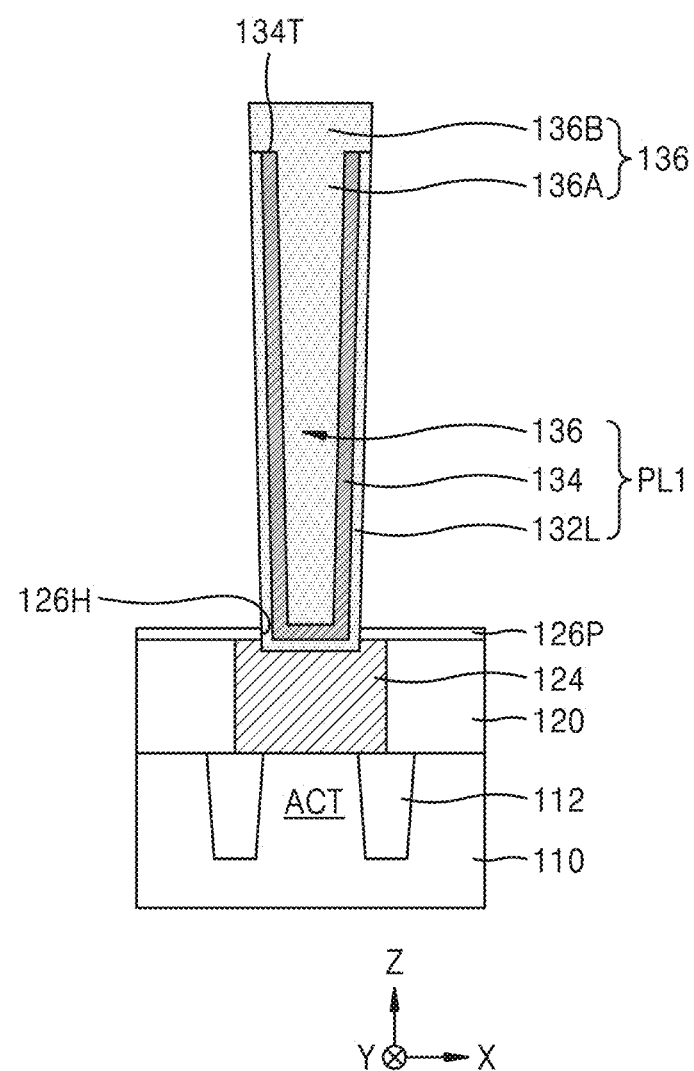

Referring to FIG. 11K, in the resulting structure of FIG. 11J, the mold pattern 128P may be removed to expose a sidewall of the preliminary bridge electrode layer 132L.

The mold pattern 128P may be removed by a wet etch process. For example, the mold pattern 128P may be removed using an etching solution containing ammonium fluoride ($NH_4F$), hydrofluoric acid (HF), and water. Since the main electrode part 134 is completely covered by the preliminary bridge electrode layer 132L and the capping electrode part 136 during the removal of the mold pattern 128P, the main electrode part 134 may not be exposed and/or etched to the etching solution and thus may not be damaged or may not be significantly damaged by the etching solution.

Figure 11L:
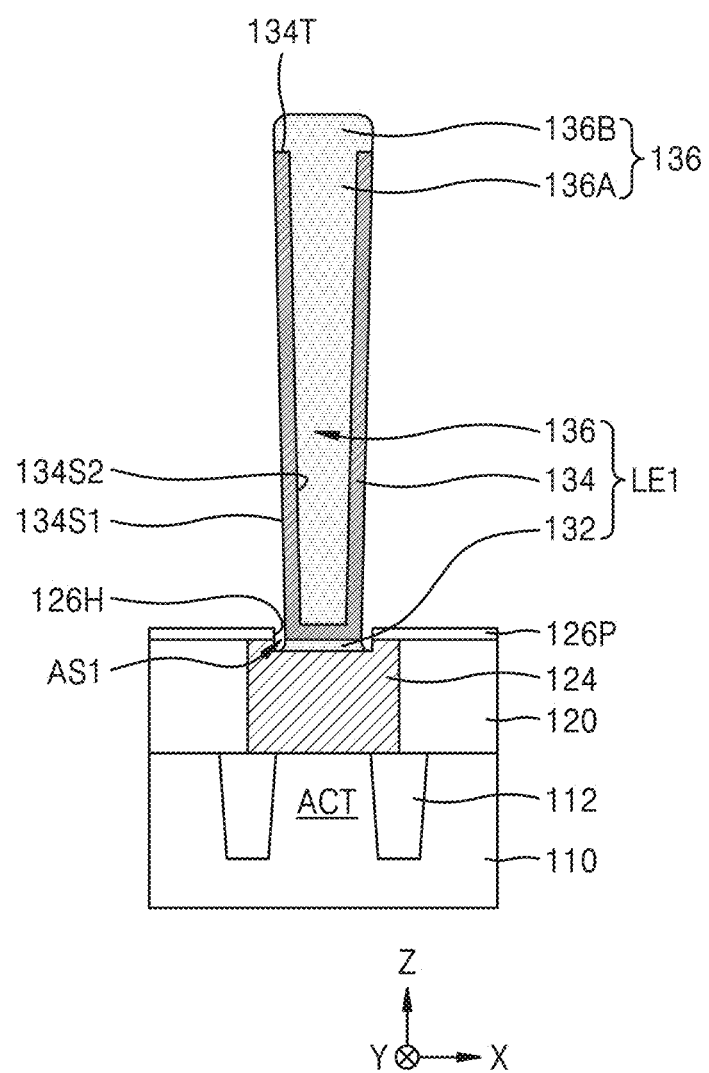

Referring to FIG. 11L, in the preliminary bridge electrode structure PL1 of FIG. 11K, a portion of the preliminary bridge electrode layer 132L may be etched to expose the outer sidewall 134S1 of the main electrode part 134.

To remove the portion of the preliminary bridge electrode layer 132L, a wet etch process of selectively etching only the preliminary bridge electrode layer 132L may be performed using a difference between an etch selectivity of the main electrode part 134 and an etch selectivity of the preliminary bridge electrode layer 132L. For example, when the main electrode part 134 is formed of Nb nitride, Nb oxide, Nb oxynitride, or a combination thereof and the preliminary bridge electrode layer 132L is formed of TiN, the exposed portion of the preliminary bridge electrode layer 132L may be selectively etched by an wet etch process using an etching solution containing sulfuric acid ($H_2SO_4$) and hydrogen peroxide ($H_2O_2$).

In some example embodiments, when each of the capping electrode part 136 and the preliminary bridge electrode layer 132L is formed of TiN, a portion of the capping electrode part 136 exposed to the etching solution may be removed while the preliminary bridge electrode layer 132L is selectively etched. When, as described with reference to FIG. 11J, the second thickness TH4 of the second part 136B of the capping electrode part 136 is greater than the thickness TH3 of the portion of the preliminary bridge electrode layer 132L covering the sidewall of the main electrode part 134, the uppermost surface 134T of the main electrode part 134 may be covered by the remaining unremoved portion of the second part 136B of the capping electrode part 136 while the portion of the preliminary bridge electrode layer 132L is removed by the etching solution until the outer sidewall 134S1 of the main electrode part 134 is exposed. For example, even when the capping electrode part 136 and the preliminary bridge electrode layer 132L are formed of the same material, the uppermost surface 134T and the inner sidewall 134S2 of the main electrode part 134 may be covered by the capping electrode part 136 without being exposed to the outside after the portion of the preliminary bridge electrode layer 132L is removed to expose the outer sidewall 134S1 of the main electrode part 134.

After the outer sidewall 134S1 of the main electrode part 134 is exposed, a portion of the preliminary bridge electrode layer 132L interposed between the conductive region 124 and the main electrode part 134 may remain as the bridge electrode part 132 without being removed by the etching solution. The bridge electrode part 132, the main electrode part 134, and the capping electrode part 136 remaining on the substrate 110 may constitute, or be included in, the lower electrode structure LE1. The ring-shaped space AS1 may remain between the bridge electrode part 132 and a sidewall of the insulation pattern 126P defining the opening 126H.

In some example embodiments, the main electrode part 134 may be plasma processed in a state in which the outer sidewall 134S1 of the main electrode part 134 is exposed after the process described with reference to FIG. 11L is performed. The plasma processing on the main electrode part 134 may be performed in the same manner as the plasma processing 138 on the main electrode layer 134L described with reference to FIG. 11G. Since the main electrode part 134 is plasma processed in the state in which the outer sidewall 134S1 of the main electrode part 134 is exposed, the impurities in the main electrode part 134 may be removed, such that the main electrode part 134 may be densified and a resistance or resistivity of the main electrode part 134 may be reduced.

When the main electrode part 134 is subject to the plasma processing 138 as described with reference to FIG. 11G, the plasma processing on the main electrode part 134 may be omitted in the process of FIG. 11L. In some example embodiments, the plasma processing 138 on the main electrode layer 134L performed in the process of FIG. 11G may be omitted and the plasma processing on the main electrode part 134 may be performed in the process of FIG. 11L. In some example embodiments, all of the plasma processing 138 performed on the main electrode layer 134L in the process of FIG. 11G and the plasma processing performed on the main electrode part 134 in the process of FIG. 11L may omitted.

Figure 11M:
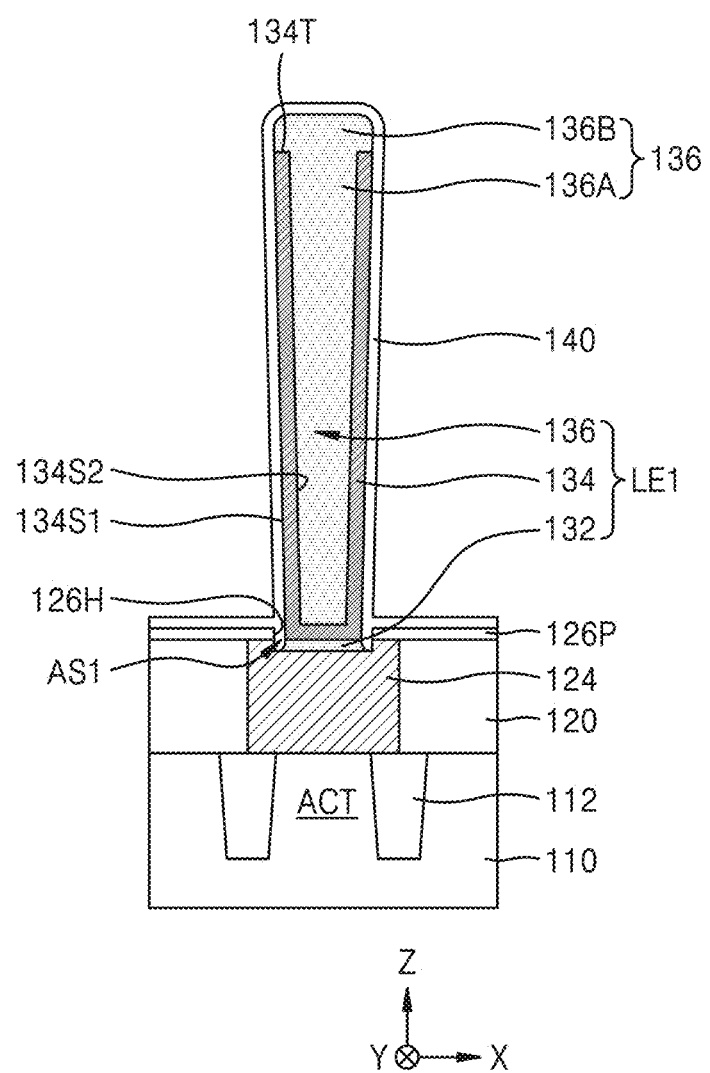

Referring to FIG. 11M, the dielectric layer 140 may be formed to cover the exposed surface of the lower electrode structure LE1. At that time, the ring-shaped space AS1 may be filled with the dielectric layer 140.

In some example embodiments, the dielectric layer 140 may be formed by an ALD process. The ALD process of forming the dielectric layer 140 may be performed by a non-limiting example process as follows. First, a metallic precursor may be supplied on the substrate 110, on which the lower electrode structure LE1 exposed in a reaction space is formed, to form a metallic precursor layer on the surface of the lower electrode structure LE1 and the surface of the insulation pattern 126P. The metallic precursor may include a fourth metal. In some example embodiments, the fourth metal may include Hf, Zr, Al, Nb, Ce, La, Ta, or Ti. The reaction space may be provided by a chamber for performing the ALD process. The metallic precursor may be provided in vapor form on the substrate 110. During the supply of the metallic precursor, the reaction space may be maintained at a first temperature of about 100~600° C., for example, about 150~450° C. Since the metallic precursor is provided in the vapor form on the substrate 110, a chemisorbed layer of metallic precursor and a physisorbed layer of metallic precursor may be formed on the surface of the lower electrode structure LE1 and the surface of the insulation pattern 126P. Thereafter, a purge gas may be supplied to the substrate 110 while maintaining the reaction space at the first temperature, thus eliminating unnecessary by-products from the substrate 110. At that time, the physisorbed layer of metallic precursor remaining on the substrate 110 may also be removed. The purge gas may contain an inert gas, such as at least one of Ar, He, Ne, etc., or an $N_2$ gas. An oxidizing reaction gas may be supplied to the substrate 110 to form a metal oxide layer from the chemisorbed layer of metallic precursor. The oxidizing reaction gas may contain $O_2$, $O_3$, plasma $O_2$, $H_2O$, $NO_2$, NO, $N_2O$, $CO_2$, $H_2O_2$, HCOOH, $CH_3COOH$, $(CH_3CO)_2O$, a combination thereof. Thereafter, the purge gas may be supplied to the substrate 110, thus eliminating the unnecessary by-products from the substrate 110. The aforementioned ALD process may be repeated until the dielectric layer 140 reaches a specified/desired thickness.

Thereafter, the upper electrode 150 may be formed on the dielectric layer 140 to manufacture the integrated circuit device 100 including the capacitor CP1 of FIG. 3. The upper electrode 150 may be formed by a CVD process, an MOCVD process, a PVD process, and/or an ALD process.

FIGS. 12A to 12E are cross-sectional views of stages in a method of manufacturing an integrated circuit device according to some example embodiments of inventive concepts. An example method of manufacturing the integrated circuit device 200 of FIG. 4 will be described with reference to FIGS. 12A to 12E.

Figure 12A:
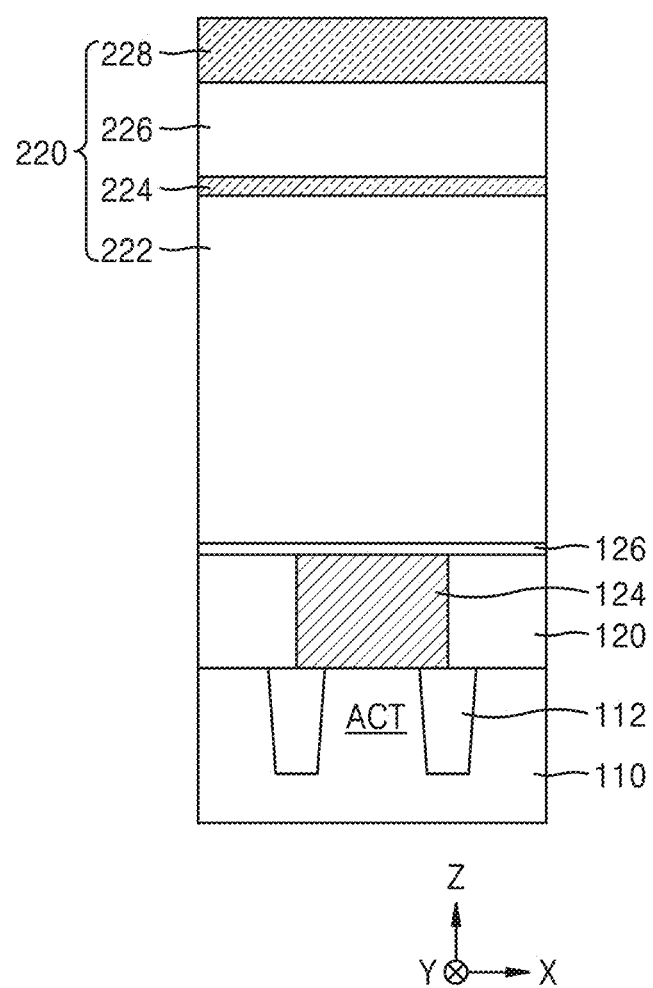
FIGS. 12A to 12E are cross-sectional views of stages in a method of manufacturing an integrated circuit device according to some example embodiments of inventive concepts.

Referring to FIG. 12A, after the insulation layer 126 covering the lower structure 120 and the conductive region 124 is formed on the substrate 110 by performing the same process as described with reference to FIG. 11A, a mold structure 220 may be formed on the insulation layer 126.

The mold structure 220 may include a first mold layer 222, a first supporting layer 224, a second mold layer 226, and a second supporting layer 228 that are sequentially stacked on the insulation layer 126. The first mold layer 222 and the second mold layer 226 may each include an insulation material having an etch selectivity with respect to the insulation layer 126. In some example embodiments, the first mold layer 222 and the second mold layer 226 may be formed of or may include an oxide layer. The first supporting layer 224 and the second supporting layer 228 may include a material having an etch selectivity with respect to the first mold layer 222 and the second mold layer 226, respectively. The first supporting layer 224 and the second supporting layer 228 may be formed of or may include a material having a relatively low etch rate with respect to an etchant, for example, an etching solution containing ammonium fluoride ($NH_4F$), hydrofluoric acid (HF), and water, to be used when the first mold layer 222 and the second mold layer 226 are removed in the subsequent process.

Figure 12B:
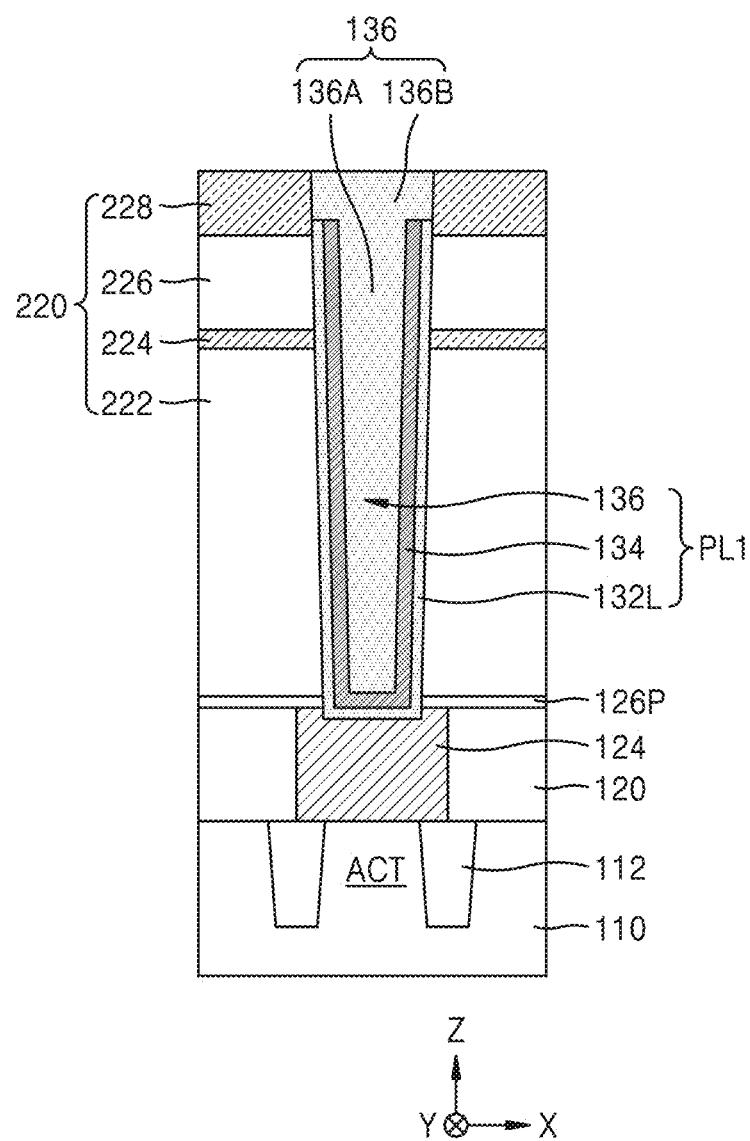

Referring to FIG. 12B, the processes described with reference to FIGS. 11C to 11J may be performed on the resulting structure of FIG. 12A, thus forming a preliminary lower electrode structure PL1 extending through the mold structure 220.

Figure 12C:
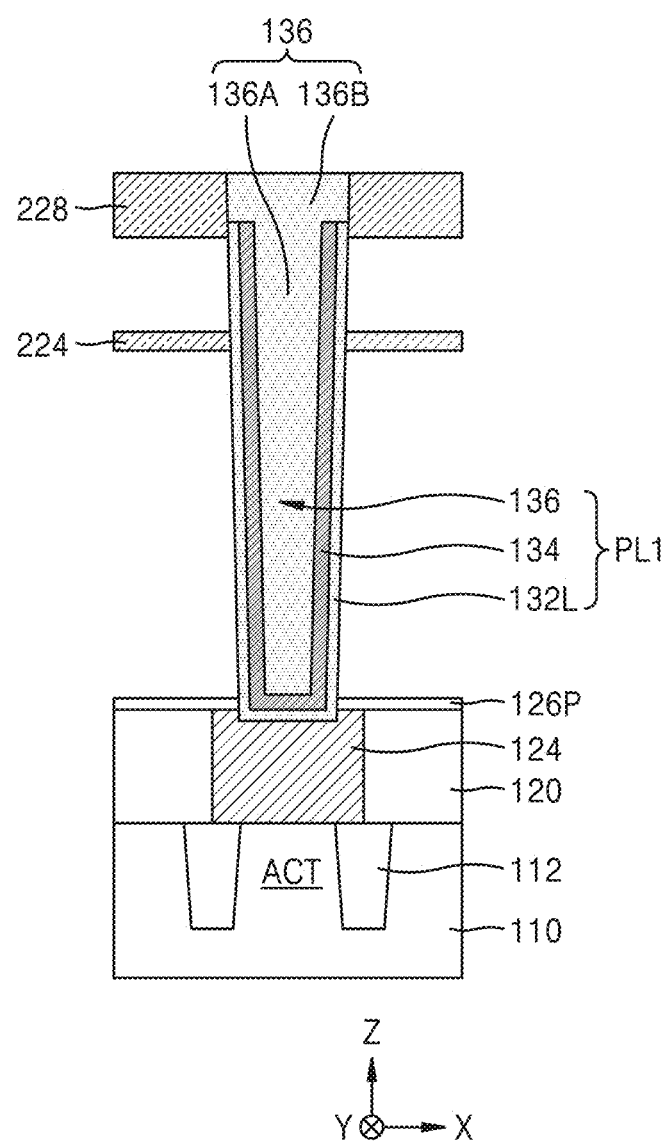

Referring to FIG. 12C, the first mold layer 222 and the second mold layer 226 may be removed to expose a sidewall of the preliminary bridge electrode layer 132L.

The first mold layer 222 and the second mold layer 226 may be removed by a wet etch process. For example, the first mold layer 222 and the second mold layer 226 may be removed using the etching solution including ammonium fluoride ($NH_4F$), hydrofluoric acid (HF), and water. In a non-limiting example process for removing the first mold layer 222 and the second mold layer 226, the second supporting layer 228 may be patterned first to form an upper opening (not shown) in the second supporting layer 228, and the second mold layer 226 may be removed through the upper opening of the second supporting layer 228. Thereafter, a lower opening (not shown) may be formed in the first supporting layer 224 and the first mold layer 222 may be removed through the lower opening of the first supporting layer 224. Supporting structure of various shapes may be formed depending on locations and plane shapes of the upper opening of the second supporting layer 228 and the lower opening of the first supporting layer 224. For example, the first supporting layer 324 and the second supporting layer 328 included in the integrated circuit device 300 shown in FIG. 5 may be formed instead of the first supporting layer 224 and the second supporting layer 228. After the first mold layer 222 and the second mold layer 226 are removed, the preliminary lower electrode structure PL1 may be supported by the first supporting layer 224 and the second supporting layer 228.

Figure 12D:
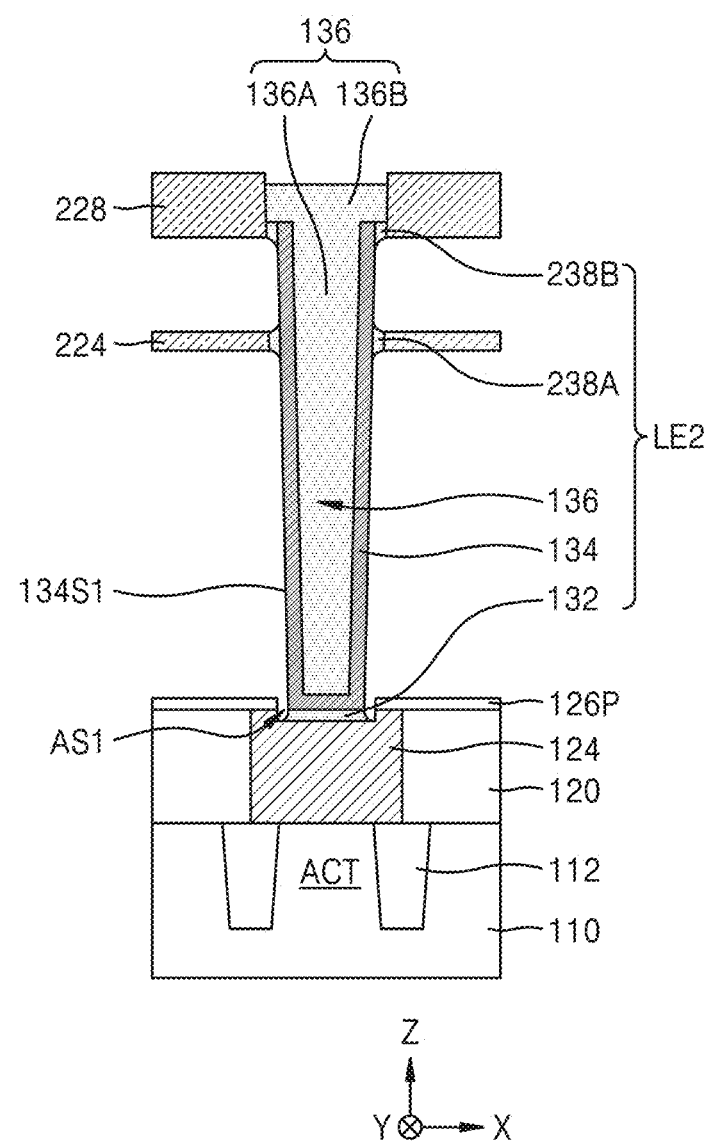

Referring to FIG. 12D, the exposed portions of the preliminary bridge electrode layer 132L in the preliminary lower electrode structure PL1 may be etched by a similar process as described with reference to FIG. 11L, thus exposing the outer sidewall 134S1 of the main electrode part 134.

After the outer sidewall 134S1 of the main electrode part 134 is exposed, a portion of the preliminary bridge electrode layer 132L interposed between the conductive region 124 and the main electrode part 134 may remain as the bridge electrode part 132 without being removed. In addition, portions of the preliminary bridge electrode layer 132L interposed between the outer sidewall 134S1 of the main electrode part 134 and each of the first supporting layer 224 and the second supporting layer 228 may remain as a plurality of protrusion electrode parts 238A and 238B without being removed.

While the exposed portion of the preliminary bridge electrode layer 132L is etched until the outer sidewall 134S1 of the main electrode part 134 is exposed, the exposed portion of the second part 136B of the capping electrode part 136 covering the uppermost surface 134T of the main electrode part 134 may be partly removed, such that a thickness of the second part 136B of the capping electrode part 136 may be reduced.

The bridge electrode part 132, the main electrode part 134, the capping electrode part 136, and the plurality of protrusion electrode parts 238A and 238B may constitute, or be included in, the lower electrode structure LE2. The plurality of protrusion electrode parts 238A and 238B may serve to prevent leaning, bending, or collapsing of the lower electrode structure LE2.

Figure 12E:
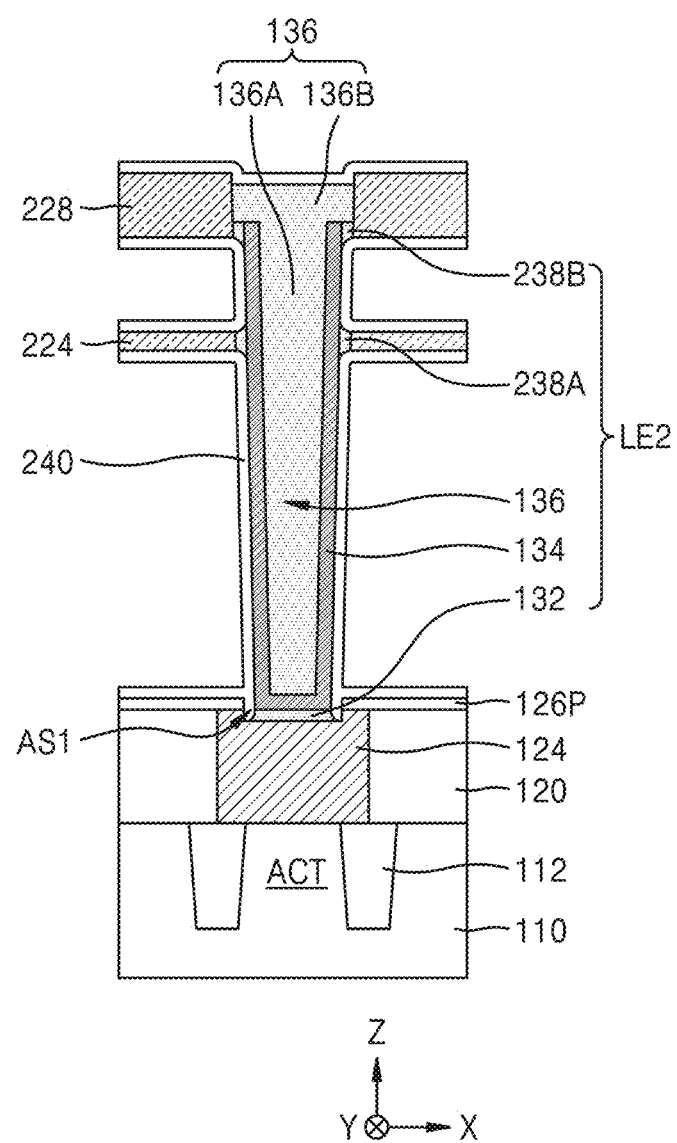

Referring to FIG. 12E, the dielectric layer 240 may be formed by a similar process to the process of forming the dielectric layer 140 described with reference to FIG. 11M to cover the exposed surface of the lower electrode structure LE2.

Thereafter, the upper electrode 250 may be formed on the resulting structure of FIG. 12E to cover the dielectric layer 240, thus manufacturing the integrated circuit device 200 including the capacitor CP2 of FIG. 4.

FIGS. 13A to 13D are cross-sectional views of stages in a method of manufacturing an integrated circuit device according to some example embodiments of inventive concepts. An example method of manufacturing the integrated circuit device 400 of FIG. 7 will be described with reference to FIGS. 13A to 13D.

Figure 13A:
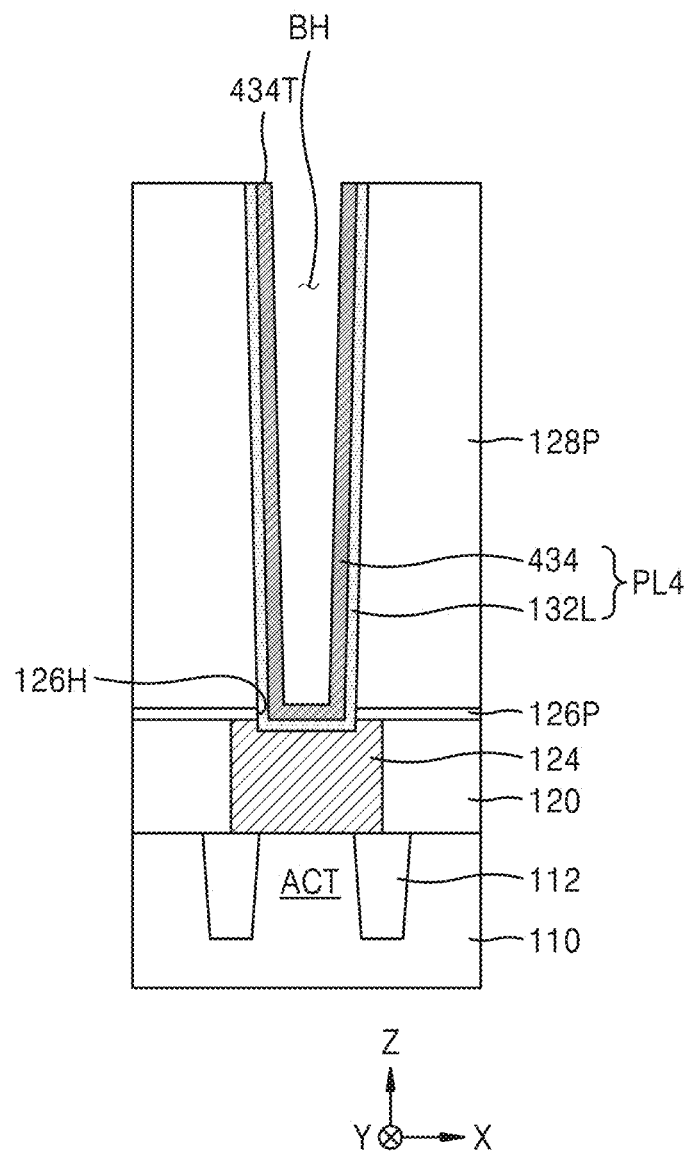
FIGS. 13A to 13D are cross-sectional views of stages in a method of manufacturing an integrated circuit device according to some example embodiments of inventive concepts.

Referring to FIG. 13A, after the processes as described with reference to FIGS. 11A to 11G are performed, the main electrode layer 134L and the preliminary bridge electrode layer 132L may be etch-backed by a similar process as described with reference to FIG. 11H and then the sacrificial pattern SLP (refer to FIG. 11H) may be removed to expose an upper surface of the mold pattern 128P. Thus, the main electrode part 434 may be formed from the main electrode layer 134L. The main electrode part 434 may have the uppermost surface 434T having substantially the same level as the uppermost surface of the mold pattern 128P. The preliminary bridge electrode layer 132L and the main electrode part 434 may constitute, or be included in, the preliminary lower electrode part PL4.

Figure 13B:
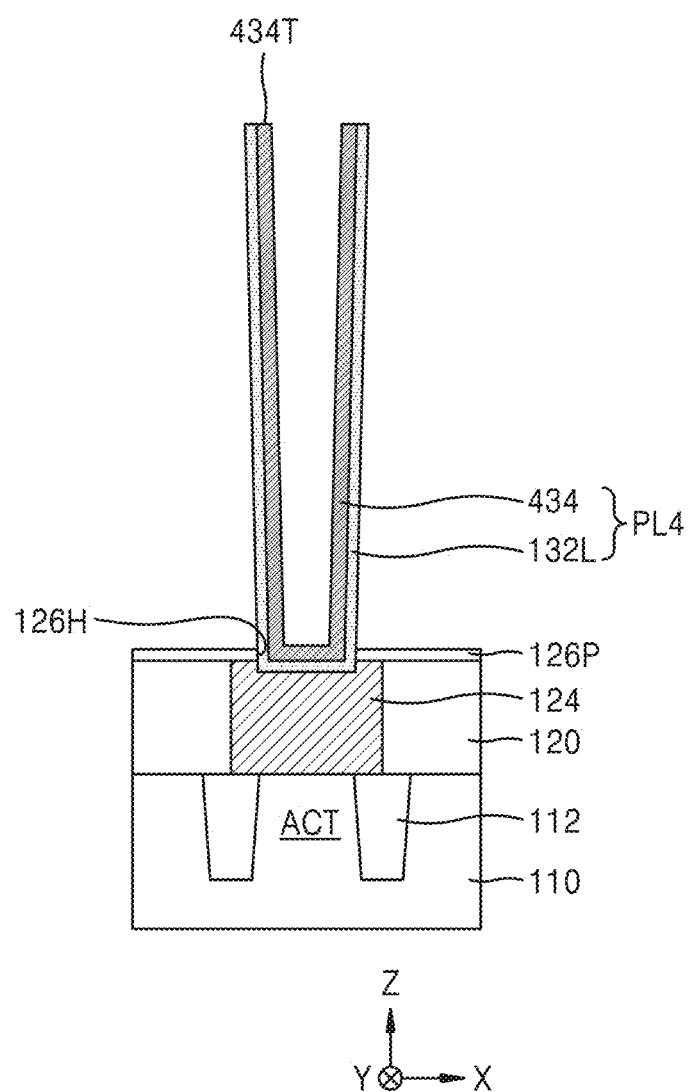

Referring to FIG. 13B, the mold pattern 128P may be removed from the resulting structure of FIG. 13A by a similar process as described with reference to FIG. 11K to expose a sidewall of the preliminary bridge electrode layer 132L.

Figure 13C:
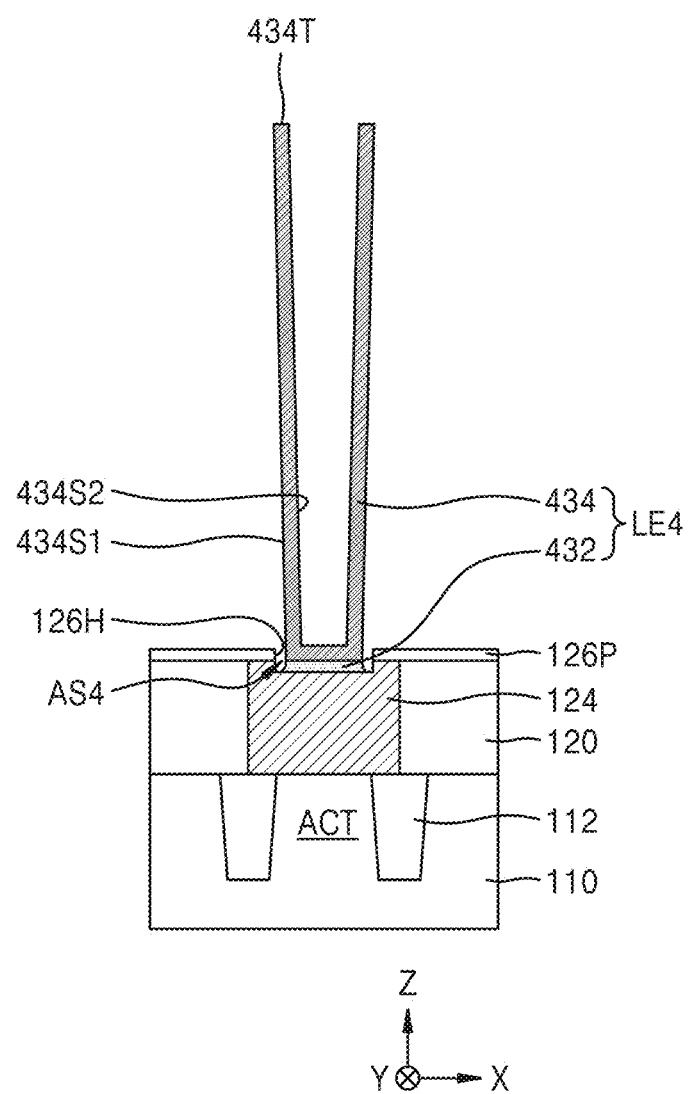

Referring to FIG. 13C, the exposed portion of the preliminary bridge electrode layer 132L may be selectively etched from the preliminary lower electrode structure PL4 by a similar process as described with reference to FIG. 11L, thus exposing the outer sidewall 434S1 of the main electrode part 434.

While the exposed portion of the preliminary bridge electrode layer 132L is selectively etched, the main electrode part 434 may also be exposed to the etch solution for etching the preliminary bridge electrode layer 132L. At that time, since the main electrode part 434 is densified by the plasma processing 138 described with reference to FIG. 11G, even if the main electrode part 434 is exposed to the etching solution, damage to or loss of the main electrode part 434 by the etching solution may be suppressed or reduced in likelihood of occurrence.

After the outer sidewall 434S1 of the main electrode part 434 is exposed, a portion of the preliminary bridge electrode layer 132L interposed between the conductive region 124 and the main electrode part 434 may remain as the bridge electrode part 432. The bridge electrode part 432 and the main electrode part 434 may constitute, or be included in, the lower electrode structure LE4. After the outer sidewall 434S1 of the main electrode part 434 is exposed, the ring-shaped space AS4 may remain between the bridge electrode part 432 and a sidewall of the insulation pattern 126P defining the opening 126H.

Figure 13D:
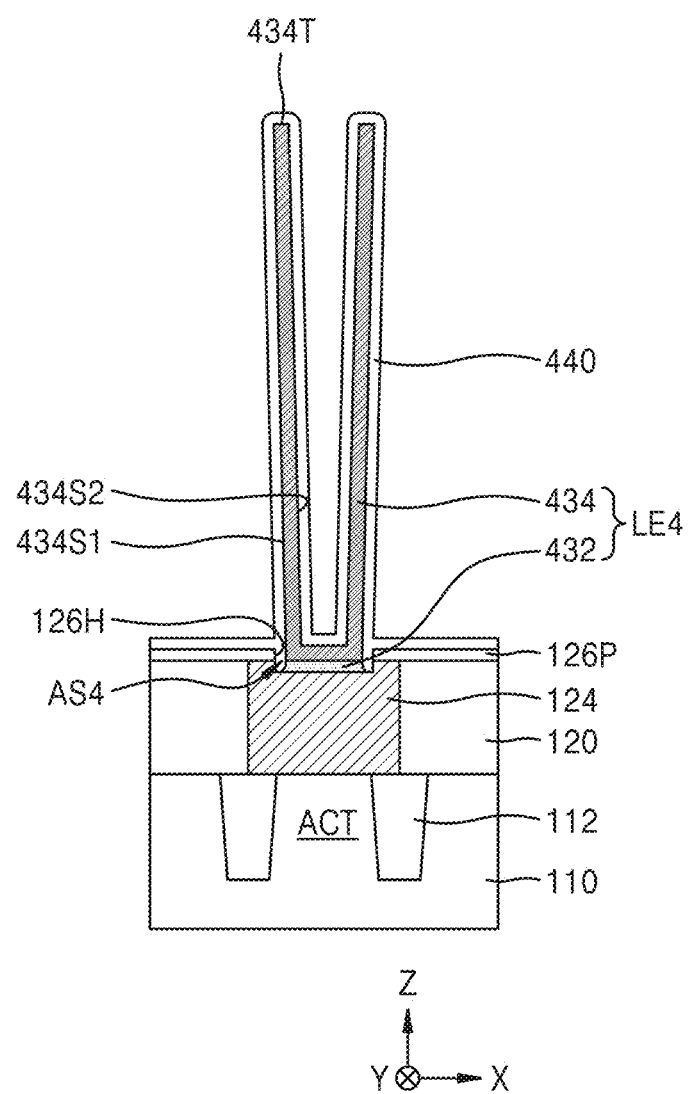

Referring to FIG. 13D, the dielectric layer 440 may be formed by a similar process to the process of forming the dielectric layer 140 described with reference to FIG. 11M to cover the exposed surface of the lower electrode structure LE4. The ring-shaped space AS4 may be filled with the dielectric layer 440. The dielectric layer 440 may be conformally formed along the outer sidewall 434S1, the inner sidewall 434S2, and the uppermost surface 434T, of the main electrode part 434.

Thereafter, the upper electrode 450 may be formed on the resulting structure of FIG. 13D to cover the dielectric layer 440, thus manufacturing the integrated circuit device 400 including the capacitor CP4 of FIG. 7.

FIGS. 14A to 14D are cross-sectional views of stages in a method of manufacturing an integrated circuit device according to some example embodiments of inventive concepts. An example method of manufacturing the integrated circuit device 500 of FIG. 8 will be described with reference to FIGS. 14A to 14D.

Figure 14A:
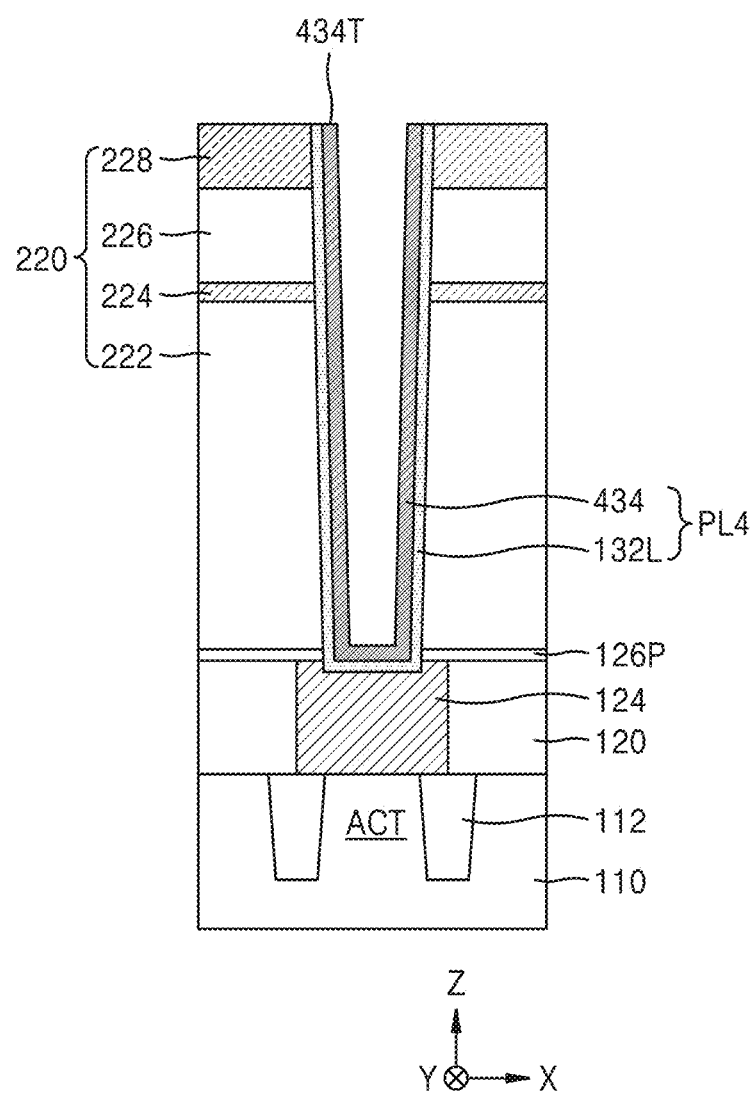
FIGS. 14A to 14D are cross-sectional views of stages in a method of manufacturing an integrated circuit device according to some example embodiments of inventive concepts.

Referring to FIG. 14A, after the mold structure 220 is formed on the insulation layer 126 by performing the same process as described with reference to FIG. 12A, the preliminary lower electrode structure PL4 extending through the mold structure 220 may be formed by a similar process as described with reference to FIG. 13E.

Figure 14B:
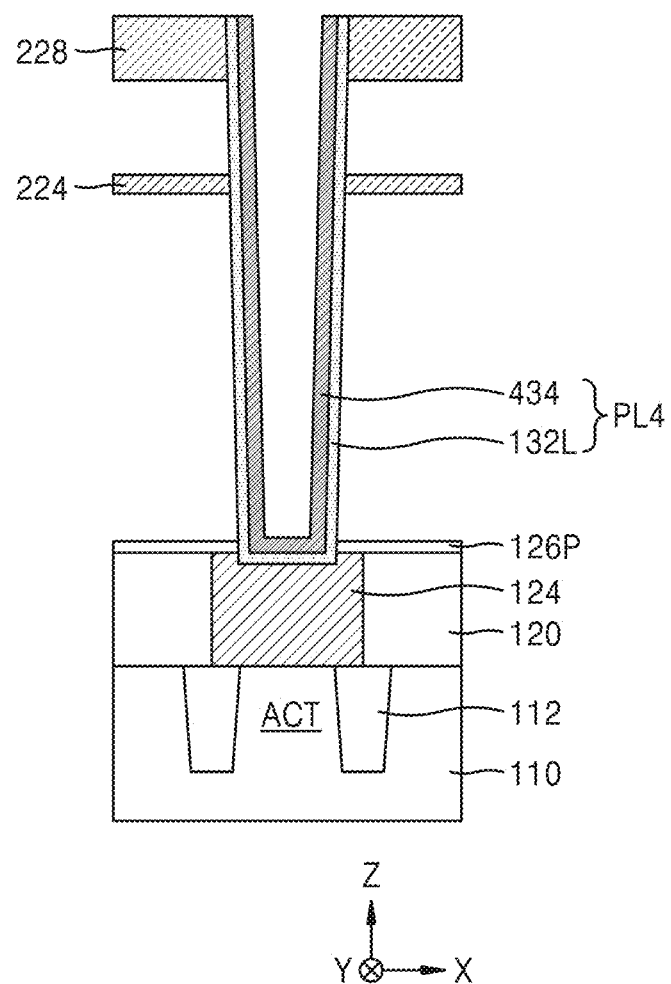

Referring to FIG. 14B, the first mold layer 222 and the second mold layer 226 may be removed by a similar process as described with reference to FIG. 12C to expose a sidewall of the preliminary bridge electrode layer 132L.

While the first mold layer 222 and the second mold layer 226 are removed, the main electrode part 434 may be exposed to the etching solution for removing the first mold layer 222 and the second mold layer 226. At that time, since the main electrode part 434 is densified by the plasma processing 138 described with reference to FIG. 11G, even if the main electrode part 434 is exposed to the etching solution, damage to or loss of the main electrode part 434 by the etching solution may be suppressed.

Figure 14C:
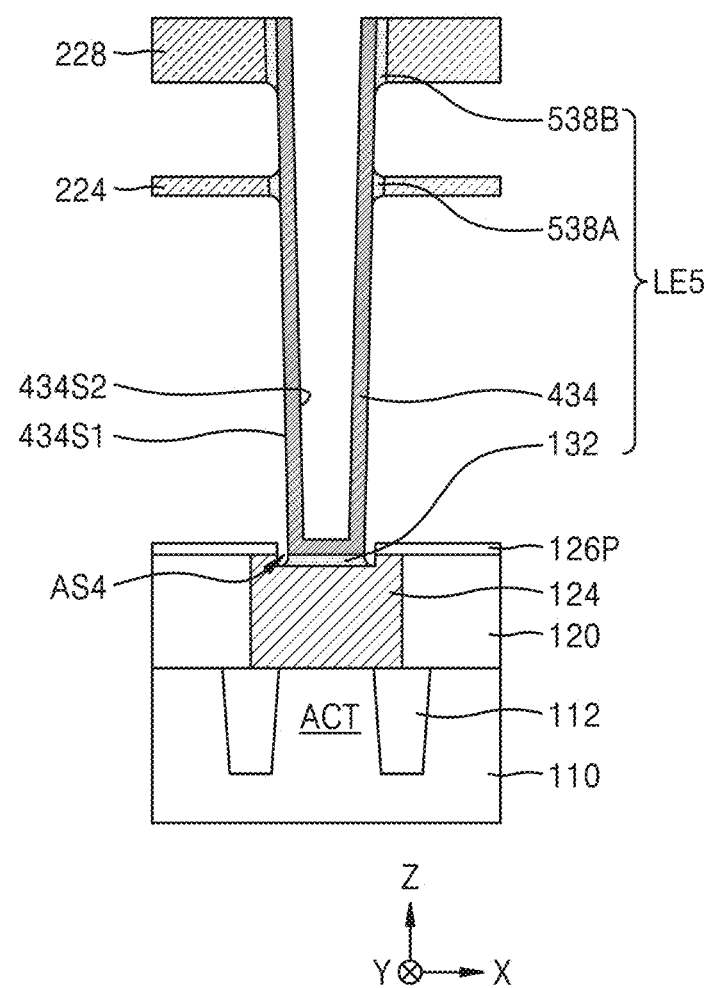

Referring to FIG. 14C, the exposed portions of the preliminary bridge electrode layer 132L may be etched from the preliminary lower electrode structure PL4 by a similar process as described with reference to FIG. 12D, thus exposing the outer sidewall 434S1 of the main electrode part 434.

After the outer sidewall 434S1 of the main electrode part 434 is exposed, a portion of the preliminary bridge electrode layer 132L interposed between the conductive region 124 and the main electrode part 434 may remain as the bridge electrode part 132 without being removed. In addition, portions of the preliminary bridge electrode layer 132L interposed between the outer sidewall 434S1 of the main electrode part 434 and each of the first supporting layer 224 and the second supporting layer 228 may remain as a plurality of protrusion electrode parts 538A and 538B without being removed.

The bridge electrode part 132, the main electrode part 434, and the plurality of protrusion electrode parts 538A and 538B may constitute, or be included in, the lower electrode structure LE5. The plurality of protrusion electrode parts 538A and 538B may serve to prevent leaning, bending, or collapsing of the lower electrode structure LE5.

After the outer sidewall 434S1 of the main electrode part 434 is exposed, the ring-shaped space AS4 may remain between the bridge electrode part 132 and the insulation pattern 126P.

Figure 14D:
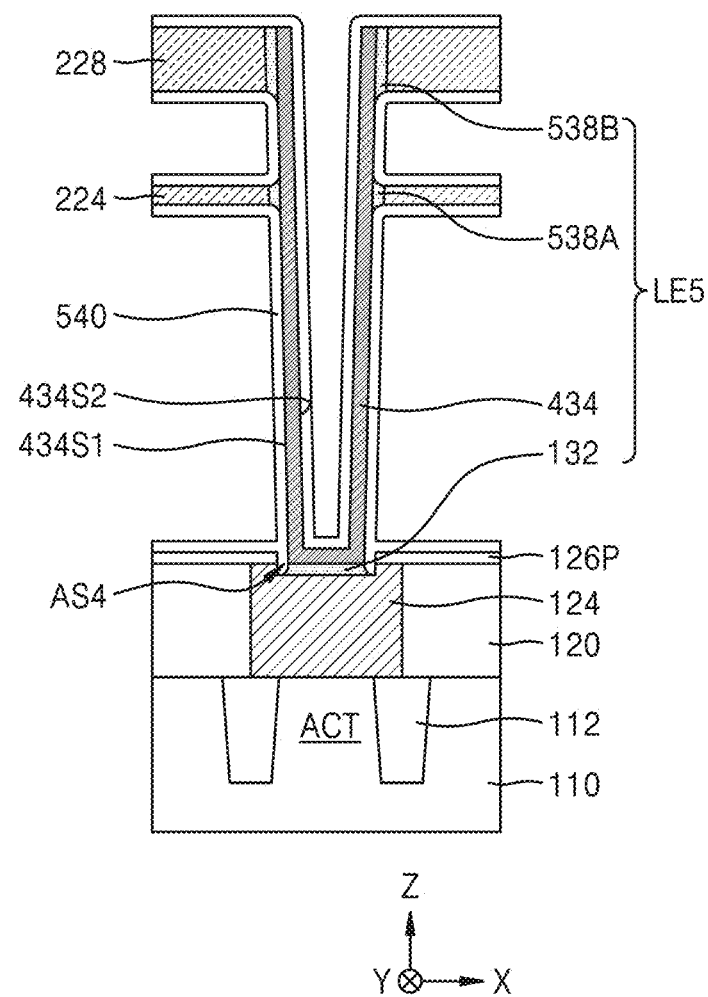

Referring to FIG. 14D, the dielectric layer 540 covering the exposed surface of the lower electrode structure LE5 may be formed by a similar process as described with reference to FIG. 12E. The dielectric layer 540 may conformally cover an outer sidewall of the lower electrode structure LE5, a lower surface and an upper surface of each of the first supporting layer 224 and the second supporting layer 228, and an upper surface of the insulation pattern 126P.

Thereafter, the upper electrode 550 may be formed on the resulting structure of FIG. 14D to cover the dielectric layer 540, thus manufacturing the integrated circuit device 500 including the capacitor CP5 of FIG. 8.

While the methods of manufacturing the integrated circuit devices 100, 200, 300, 400, and 500 shown in FIGS. 3 to 8 are described with reference to FIGS. 12A to 14D, it will be understood by those of ordinary skill in the art that that integrated circuit devices of various structures may be manufactured through various modifications and changes within the scope of inventive concepts. For example, to manufacture the integrated circuit devices 600 and 700 including the capping electrode part 636 shown in FIGS. 9 and 10, the processes described with reference to FIGS. 11A to 11M, the processes described with reference to FIGS. 12A to 12E, or a combination thereof may be used. Specifically, in the process described with reference to FIG. 11I, after a capping electrode layer 136L is formed to fill a portion of the hole BH instead of forming the capping electrode layer 136L, the subsequent processes may be performed to manufacture the integrated circuit device 600 shown in FIG. 9 or the integrated circuit device 700 shown in FIG. 10.

While the present inventive concepts have been shown and described with reference to some example embodiments thereof, it will be understood by those of ordinary skill in the art that various changes in form and details may be made thereto without departing from the spirit and scope of the present inventive concepts as set forth by the following claims.

What is claimed is:

1. An integrated circuit device comprising:
   a substrate;
   an insulating interlayer on the substrate;
   an etch stop layer on the insulating interlayer;
   a lower electrode structure disposed over the insulating interlayer;
   a dielectric layer disposed on the lower electrode structure; and
   an upper electrode disposed on the dielectric layer, wherein the lower electrode structure includes a first lower electrode, a second lower electrode that is disposed on the first lower electrode, and a third lower electrode that is disposed on the second lower electrode, a bottom surface of the second lower electrode of the lower electrode structure contacts a top surface of the first lower electrode of the lower electrode structure, the dielectric layer contacts the first lower electrode, the second lower electrode and the third lower electrode of the lower electrode structure, and an outer bottommost point of the dielectric layer is below a topmost surface of the insulating interlayer.

2. The integrated circuit device according to claim 1, wherein the third lower electrode of the lower electrode structure contacts an inner side surface, an inner bottom surface and a top surface of the second lower electrode of the lower electrode structure.

3. The integrated circuit device according to claim 1, wherein the second lower electrode of the lower electrode structure includes at least one of niobium nitride, niobium oxide, or niobium oxynitride.

4. The integrated circuit device according to claim 1, wherein the dielectric layer includes hafnium oxide.

5. The integrated circuit device according to claim 1, wherein the lower electrode structure includes a fourth lower electrode that is the same material as the first lower electrode and the third lower electrode of the lower electrode structure.

6. The integrated circuit device according to claim 5, further comprising a supporting layer that is disposed over the substrate, wherein the fourth lower electrode of the lower electrode structure is disposed between the second lower electrode of the lower electrode structure and the supporting layer.

7. The integrated circuit device according to claim 1, wherein the second lower electrode of the lower electrode structure is cylinder-shaped with an upper opened end, and the third lower electrode of the lower electrode structure is cylinder-shaped with a filled interior.

8. The integrated circuit device according to claim 1, wherein the third lower electrode of the lower electrode structure includes a first portion that is in contact with an inner bottom surface and an inner side surface of the second lower electrode of the lower electrode structure, and a second portion that is disposed on the first portion.

9. The integrated circuit device according to claim 8, wherein a bottom surface of the second portion of the third lower electrode of the lower electrode structure contacts a top surface of the second lower electrode of the lower electrode structure.

10. The integrated circuit device according to claim 8, wherein a width of the first portion of the third lower electrode of the lower electrode structure is less than a width of the second portion of the third lower electrode of the lower electrode structure.

11. The integrated circuit device according to claim 8, wherein the first portion of the third lower electrode of the lower electrode structure is spaced apart from the dielectric layer, and the second portion of the third lower electrode of the lower electrode structure contacts the dielectric layer.

12. The integrated circuit device according to claim 1, further comprising:

a contact plug disposed in the insulating interlayer, wherein the first lower electrode of the lower electrode structure passes through the etch stop layer and contacts the contact plug, and the dielectric layer passes through the etch stop layer and contacts the contact plug.

13. The integrated circuit device according to claim 8, further comprising a supporting layer that is disposed over the substrate, wherein the supporting layer contacts a side surface of the second portion of the third lower electrode of the lower electrode structure.

14. The integrated circuit device according to claim 5, wherein the third lower electrode of the lower electrode structure is spaced apart from the first lower electrode of the lower electrode structure, and contacts the second lower electrode and the fourth lower electrode of the lower electrode structure.

15. An integrated circuit device comprising:

a substrate;
an insulating interlayer on the substrate;
an etch stop layer on the insulating interlayer;
a lower electrode structure disposed over the insulating interlayer;
a dielectric layer disposed on the lower electrode structure; and
an upper electrode disposed on the dielectric layer,
wherein the lower electrode structure includes a first lower electrode, a second lower electrode that is disposed on the first lower electrode, and a third lower electrode that is disposed on the second lower electrode,
a bottom surface of the second lower electrode of the lower electrode structure contacts a top surface of the first lower electrode of the lower electrode structure,
the third lower electrode of the lower electrode structure includes a first portion that is in contact with an inner bottom surface and an inner side surface of the second lower electrode of the lower electrode structure, and a second portion that is disposed on the first portion,
a bottom surface of the second portion of the third lower electrode of the lower electrode structure contacts a top surface of the second lower electrode of the lower electrode structure,
an outer bottommost point of the dielectric layer is below a topmost surface of the insulating interlayer, and
a width of the first portion of the third lower electrode of the lower electrode structure is less than a width of the second portion of the third lower electrode of the lower electrode structure.

16. The integrated circuit device according to claim 15, wherein the dielectric layer contacts the first lower electrode, the second lower electrode and the third lower electrode of the lower electrode structure.

17. The integrated circuit device according to claim 15, wherein the second lower electrode of the lower electrode structure includes at least one of niobium, nitride, niobium oxide, or niobium oxynitride, and the dielectric layer includes hafnium oxide.

18. The integrated circuit device according to claim 15, the first portion of the third lower electrode of the lower electrode structure is spaced apart from the dielectric layer, and the second portion of the third lower electrode of the lower electrode structure contacts the dielectric layer.

19. An integrated circuit device comprising:

a substrate;
an insulating interlayer disposed on the substrate;

an etch stop layer disposed on the insulating interlayer;
a contact plug disposed in the insulating interlayer;
a lower electrode structure disposed on the contact plug;
a dielectric layer disposed on the lower electrode structure and including hafnium oxide; and
an upper electrode disposed on the dielectric layer,
wherein the lower electrode structure includes a first lower electrode, a second lower electrode that is disposed on the first lower electrode, and a third lower electrode that is disposed on the second lower electrode,
the second lower electrode of the lower electrode structure includes at least one of niobium, nitride, niobium oxide, or niobium oxynitride,
the first lower electrode of the lower electrode structure passes through the etch stop layer and contacts the contact plug,
an outer bottommost point of the dielectric layer is below a topmost surface of the insulating interlayer,
a bottom surface of the second lower electrode of the lower electrode structure contacts a top surface of the first lower electrode of the lower electrode structure,
the third lower electrode of the lower electrode structure includes a first portion that is in contact with an inner bottom surface and an inner side surface of the second lower electrode of the lower electrode structure, and a second portion that is disposed on the first portion,
a bottom surface of the second portion of the third lower electrode of the lower electrode structure contacts a top surface of the second lower electrode of the lower electrode structure,
a width of the first portion of the third lower electrode of the lower electrode structure is less than a width of the second portion of the third lower electrode of the lower electrode structure,
the first portion of the third lower electrode of the lower electrode structure is spaced apart from the dielectric layer, and
the second portion of the third lower electrode of the lower electrode structure contacts the dielectric layer.

20. The integrated circuit device according to claim 19, wherein the dielectric layer contacts the first lower electrode, the second lower electrode and the third lower electrode.

* * * * *